US006981915B2

(12) United States Patent
Moore et al.

(10) Patent No.: US 6,981,915 B2
(45) Date of Patent: Jan. 3, 2006

(54) AIRFLOW VOLUME CONTROL SYSTEM

(75) Inventors: David Allen Moore, Tomball, TX (US); Abdlmonem H. Beitelmal, Los Altos, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/799,730

(22) Filed: Mar. 15, 2004

(65) Prior Publication Data

US 2005/0208888 A1 Sep. 22, 2005

(51) Int. Cl.
*F24F 7/007* (2006.01)
(52) U.S. Cl. ............ 454/184; 251/129.04; 251/129.15; 137/553
(58) Field of Classification Search ................ 454/184; 251/129.04, 129.15, 326; 137/553; 116/277
See application file for complete search history.

(56) References Cited

U.S. PATENT DOCUMENTS

| 4,893,551 | A | * | 1/1990 | Sharp et al. .................. 454/56 |
| 5,145,456 | A | * | 9/1992 | Ito et al. ....................... 454/75 |
| 5,461,875 | A | * | 10/1995 | Lee et al. ....................... 62/89 |
| 6,409,143 | B1 | * | 6/2002 | Beck et al. ............ 251/129.04 |

* cited by examiner

*Primary Examiner*—Harold Joyce
(74) *Attorney, Agent, or Firm*—Richard P. Lange

(57) ABSTRACT

A control system for controlling airflow through a vent. The system includes a vent assembly having a frame. The frame includes an opening to allow air to flow through the frame. The vent assembly also includes a movable damper for variably restricting the fluid flow through the opening in the vent assembly, a motor for controlling movement of the damper, and a sensor for determining the position of the damper. In addition, a controller is provided to control the motor to vary the position of the damper to thereby vary the airflow through the opening in the vent assembly.

54 Claims, 12 Drawing Sheets

| | | |
|---|---|---|
| 352a | O O O | CLOSED | 354a |
| 352b | O O X | 1/7 OPEN | 354b |
| 352c | O X O | 2/7 OPEN | 354c |
| 352d | O X X | 3/7 OPEN | 354d |
| 352e | X O O | 4/7 OPEN | 354e |
| 352f | X O X | 5/7 OPEN | 354f |
| 352g | X X O | 6/7 OPEN | 354g |
| 352h | X X X | FULLY OPEN | 354h |

AIRFLOW VOLUME CONTROL SYSTEM

BACKGROUND OF THE INVENTION

A data center may be defined as a location, e.g., room, that houses numerous printed circuit (PC) board electronic systems arranged in a number of racks. A standard rack may be defined as an Electronics Industry Association (EIA) enclosure, 78 in. (2 meters) wide, 24 in. (0.61 meter) wide and 30 in. (0.76 meter) deep. Standard racks may be configured to house a number of PC boards, e.g., about forty (40) boards, with future configurations of racks being designed to accommodate up to eighty (80) boards. The PC boards typically include a number of components, e.g., processors, microcontrollers, high speed video cards, memories, semi-conductor devices, and the like, that dissipate relatively significant amounts of heat during the operation of the respective components. For example, a typical PC board comprising multiple microprocessors may dissipate approximately 250 W of power. Thus, a rack containing forty (40) PC boards of this type may dissipate approximately 10 KW of power.

The power required to remove the heat dissipated by the components in the racks is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling fluid, e.g., air, across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of racks.

Conventional data centers are typically cooled by operation of one or more air conditioning units. The compressors of the air conditioning units typically require a minimum of about thirty (30) percent of the required cooling capacity to sufficiently cool the data centers. The other components, e.g., condensers, air movers (fans), etc., typically require an additional twenty (20) percent of the required cooling capacity. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, e.g., fans, blowers, etc. Conventional data center air conditioning units do not vary their cooling fluid output based on the distributed needs of the data center. Instead, these air conditioning units generally operate at or near a maximum compressor power even when the heat load is reduced inside the data center.

The substantially static operation of conventional vents within data centers are generally designed to operate efficiently within a relatively narrow range heat loads. However, if electronic components are allowed to exceed rated temperatures, data corruption or damage may result. Thus, conventional cooling systems and vent configurations are typically operated under worst case scenarios. For at least these reasons, cooling fluid is supplied to the components at around 100 percent of the estimated cooling requirement. In this respect, conventional cooling systems often attempt to cool components that may not be operating at levels which may cause their temperatures to exceed a predetermined temperature range. Consequently, conventional data centers often incur greater startup costs for cooling systems large enough to meet these cooling requirements as well as greater amounts of operating expenses than may be necessary to sufficiently cool the heat generating components contained in the racks of data centers.

More particularly, control of cooling fluid flow is typically based upon the selection of various floor tiles having patterns created by manufacturers. Oftentimes, conventional floor tiles do not include mechanisms configured to enable varied airflow through the floor tiles. Instead, the floor tiles are configured to provide a substantially fixed volume of cooling fluid to the racks as designed by the manufacturers. Other types of floor tiles have mechanisms that enable adjustment of cooling fluid flow through the floor tiles. However, these types of mechanisms are typically manually operated, which require technicians to physically re-position the mechanisms to vary cooling fluid flow.

In addition, conventional floor tiles are typically arranged in data centers according to predicted levels of cooling fluid requirement at various locations of the data centers. The floor tiles are typically arranged during the initial set up of the data center and thus are unable to modify cooling fluid flow volumes as the components in the data center change. In this regard, conventional floor tile implementations are typically designed to compensate for design and workload changes by operating under worst-case scenarios as described hereinabove. This oftentimes leads to inefficient and wasted energy usage to cool the components housed in the data center, which amounts to increased data center operating costs.

SUMMARY OF THE INVENTION

According to an embodiment, the present invention pertains to a control system for controlling airflow through a vent. The system includes a vent assembly having a frame. The frame includes an opening to allow air to flow through the frame. The vent assembly also includes a movable damper for variably restricting the fluid flow through the opening in the vent assembly, a motor for controlling movement of the damper, and a sensor for determining the position of the damper. In addition, a controller is provided to control the motor to vary the position of the damper to thereby vary the airflow through the opening in the vent assembly.

BRIEF DESCRIPTION OF THE DRAWINGS

Embodiments of the invention are illustrated by way of example and not limitation in the accompanying figures in which like numeral references refer to like elements, and wherein.

DETAILED DESCRIPTION OF THE INVENTION

Figure 1:
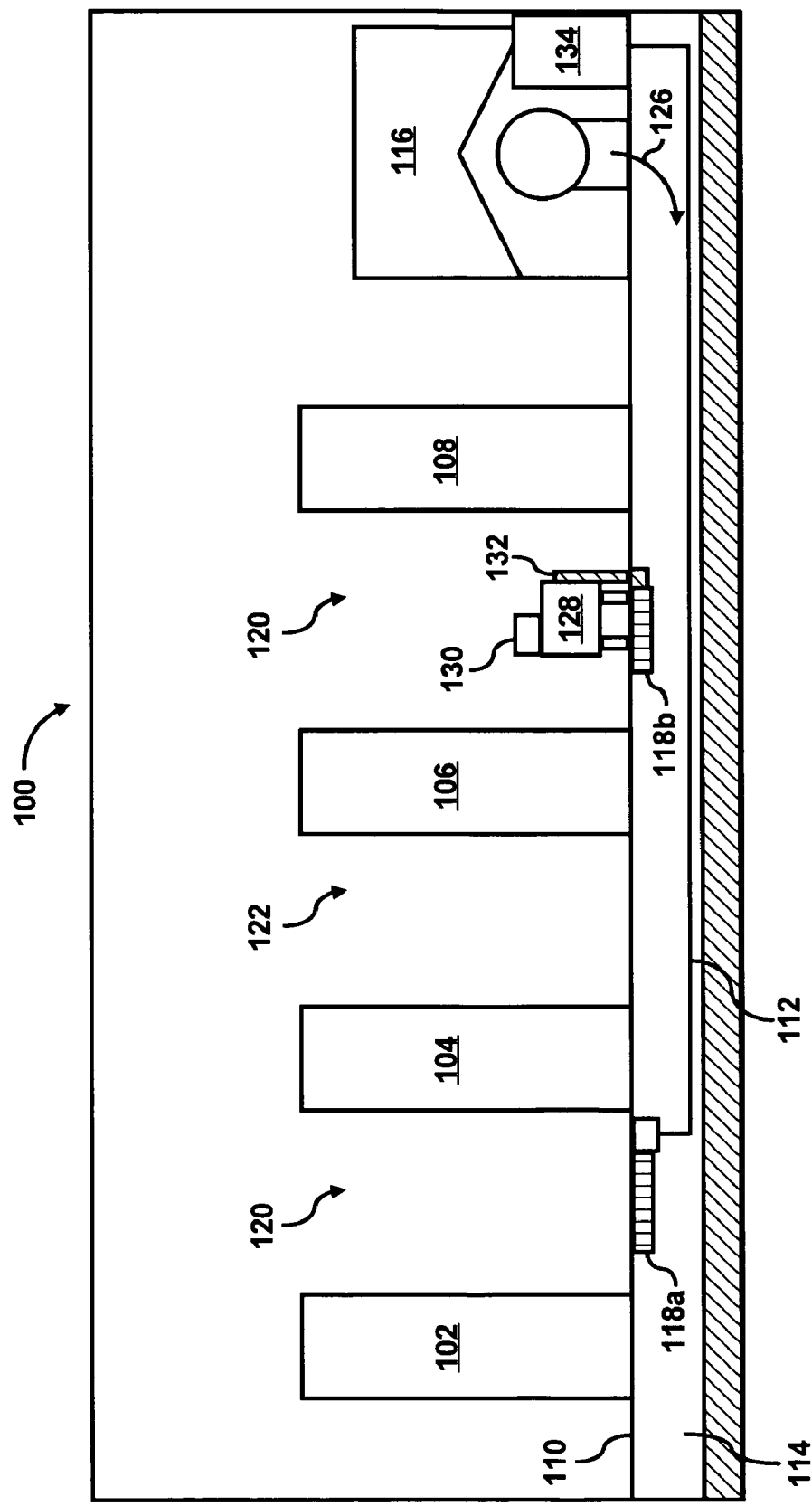
FIG. 1 shows a simplified schematic illustration of a room and cooling system according to an embodiment of the invention.

For simplicity and illustrative purposes, the principles of the invention are described by referring mainly to an embodiment thereof. In the following description, numerous specific details are set forth in order to provide a thorough understanding of the invention. It will be apparent however, to one of ordinary skill in the art, that the invention may be practiced without limitation to these specific details. In other instances, well known methods and structures have not been described in detail so as not to unnecessarily obscure the invention.

Throughout the present disclosure, reference is made to "a position code." The position code may generally be defined as a plurality of marks and spaces arranged in a manner allowing a sensor to read the marks and spaces to determine a position. In an example of the invention, the marks and spaces are arranged in rows and columns with the marks and spaces in each column comprising the position code. However, the marks and spaces may be arranged in any suitable manner to generally enable detection of the position code. The marks and spaces may be formed, for instance, by applying color to a surface in a predetermined pattern, stamping or not stamping a surface in a predetermined pattern, applying a sticker having a predetermined pattern to a surface, etc. For example: a black surface may represent a mark while a white surface may represent a space; a dent in a surface may represent a mark while a smooth or non-dented surface may represent a space; or a bar code pattern may represent the position code. One or ordinary skill in the art will recognize that the marks and spaces may be represented in any number of various implementations. Therefore, the invention is not limited to the specific types of marks and spaces described above or below.

According to an example, a vent includes an opening to allow fluid to flow therethrough and a movable damper for variably restricting the flow of fluid through the opening. The vent further includes a motor for controlling the movement of the damper and a sensor for reading the position code. The vent may also include a position code for indicating various positions of the damper. A controller may also be provided either as part of the vent or part of a separate system described below. The controller generally controls the motor to vary the position of the damper to thereby vary the fluid flow through the opening in response to a request to change the fluid flow through the vent.

In one example, the position code may be located on a surface of the vent with the sensor being positioned to move along the position code as the damper moves. In another example, the position code may be located on the damper with the sensor mounted in a stationary position on a surface of the vent. With respect to the position code and sensor location, any number of possible configurations may be implemented as long as the sensor and the position code move relative to one another as the damper moves.

In the examples below, a rectangular vent is shown. However, the vent may be configured in a variety of shapes, including but not limited to, square, circular, oval, triangular, polygonal, etc. In essence, therefore, it should be understood that the shape of the vent does not affect the operation of the vent according to examples of the invention.

When a request is made to vary the fluid flow through the vent, the controller stores a target position of the damper and activates the motor by supplying power either directly or from a power supply. As the sensor moves relative to the position codes, the sensor reads a current position of the damper and supplies this information to the controller. The controller compares the current position of the damper with the target position of the damper to achieve the desired flow output. If the current position equals the target position, the controller stops the motor by turning off the power supply.

In one example, the controller and power supply are positioned on the vent. A remote unit determines the target position of the damper and transmits the target position to the controller on the vent. The controller then changes the damper position as described above. In this example, the remote unit may be part of a cooling or heating system or a robotic device configured to determine characteristics of fluid supplied to an area cooled or heated by that vent. The remote unit may transmit the target position to the controller by way of a wireless signal or a wired signal in a variety of different formats according to known transmission protocols.

In another example, the controller and power supply may be positioned as part of a central controller. The central controller determines the target position of the damper and directly controls the motor to change the damper position as described above. In this example, the central controller may be part of or may communicate with a cooling or heating system which determines how much fluid is supplied to an area cooled or heated by the vent. The central controller supplies power to the motor and receives signals from the sensor to control the vent. Alternatively, the power supply may be located on the vent while the central controller activates or deactivates the power supply to control the motor.

In another example of the invention, the controller and power supply may be included as part of a robotic device. The robotic device may either operate alone or in conjunction with a cooling or heating system to determine fluid supply to an area cooled or heated by the vent. The robotic device may move along a floor of a room having the vent and interface with the vent. Once interfaced, the controller may supply power to the motor and receive signals from the sensor to control the vent. Alternatively, the power supply may be located on the vent while the controller in the robotic device activates or deactivates the power supply to control the motor.

Through implementation of examples of the invention, the control circuitry and associated hardware to produce a vent for variably regulating the flow of cooling fluid may be substantially reduced. The reduction of components reduces the overall costs of producing the vents. It also simplifies the control logic or programs used to control the vents. Together, this provides a significant cost savings to users.

With reference first to FIG. 1, there is shown a simplified schematic illustration of a room 100 and cooling system according to an embodiment of the invention. The room 100 is depicted as having a plurality of racks 102–108, e.g., electronics cabinets, aligned in parallel rows. Although not visible in FIG. 1, the racks 102–108 may comprise the end racks in respective rows of racks. That is, additional racks (not shown) may be located adjacent to the racks 102–108 to form rows of racks. The racks 102–108 are positioned on a raised floor 110. A plurality of wires and communication lines 112 may be located in a space 114 beneath the raised floor 110. The space 114 may also function as a plenum for delivery of cooling fluid from an air conditioning unit 116 to the racks 102–108. The cooling fluid may be delivered from the space 114 to the racks 102–108 through vents 118a and 118b located between some or all of the racks 102–108. The vents 118a and 118b are shown as being located between racks 102 and 104 and 106 and 108.

As will be described in greater detail hereinbelow, the vents 118a and 118b include openings to enable cooling fluid flow therethrough. The vents 118a and 118b also include dampers for varying the sizes of the openings to thereby vary the volume flow rates of the cooling fluid flow through the openings. The positions of the dampers may be electronically controlled to effectuate variations in the opening sizes.

The racks 102–108 are generally configured to house a plurality of components, for instance, networking equipment, storage drives, processors, micro-controllers, high-speed video cards, memories, semi-conductor devices, and the like. The components may be elements of a plurality of subsystems (not shown), for instance, computers, servers, etc. The subsystems and the components may be implemented to perform various electronic, for instance, computing, switching, routing, displaying, and the like, functions. In the performance of these electronic functions, the components, and therefore the subsystems, may generally dissipate relatively large amounts of heat. Because the racks 102–108 have generally been known to include upwards of forty (40) or more subsystems, they may transfer substantially large amounts of heat to the cooling fluid to maintain the subsystems and the components generally within predetermined operating temperature ranges.

Although the room 100 is illustrated as containing four rows of racks 102–108 and an air conditioning unit 116, it should be understood that the room 100 may include any number of racks, for instance, 100 racks, and air conditioning units, for instance, four or more. The depiction of four rows of racks 102–108 and an air conditioning unit 116 is for illustrative and simplicity of description purposes only and is not intended to limit the invention in any respect.

The areas between the racks 102 and 104 and between the racks 106 and 108 may comprise cool aisles 120. These aisles are considered "cool aisles" because they are configured to receive cooling fluid from the vents 118a and 118b, respectively. In addition, the racks 102–108 generally receive cooling fluid from the cool aisles 120. The aisles between the racks 104 and 106, and on the rear sides of racks 102 and 108, are considered hot aisles 122. These aisles are considered "hot aisles" because they are positioned to receive air heated by the components in the racks 102–108. By substantially separating the cool aisles 120 and the hot aisles 122, for instance, with the racks 102–108, the cooling fluid may substantially be prevented from re-circulating with the heated air prior to delivery into the racks 102–108.

The sides of the racks 102–108 that face the cool aisles 120 may be considered as the fronts of the racks and the sides of the racks 102–108 that face away from the cool aisles 120 may be considered as the rears of the racks. For purposes of simplicity and not of limitation, this nomenclature will be relied upon throughout the present disclosure to describe the various sides of the racks 102–108.

Although not explicitly shown, the layout of the room 100 may be varied without departing from the scope of the invention. For instance, the racks 102–108 may be positioned with their rear sides adjacent to one another (not shown) and the vents 118a and 118b may be provided in each aisle 120 and 122. In addition, the racks 102–108 may comprise outlets on top panels thereof to enable heated air to flow out of the racks 102–108.

The air conditioning unit 116 receives heated air through one or more inlets and cools the heated air. In addition, the air conditioning unit 116 supplies the racks 102–108 with air that has been cooled in any reasonably suitable known manner, for instance, as disclosed in commonly assigned U.S. Pat. No. 6,574,104, the disclosure of which is hereby incorporated by reference in its entirety. The air conditioning unit 116 supplies cooling fluid (e.g., air) into the space 114 (e.g., plenum) as also disclosed in the U.S. Pat. No. 6,574,104 patent.

In operation, cooling fluid generally flows into the space 114 as indicated by the arrow 126. The cooling fluid flows out of the raised floor 110 and into various areas of the racks 102–108 through the vents 118a and 118b. The amount of cooling fluid supplied to the cool aisles 120 may be varied according to the heat generated by the racks 102–108. Accordingly, for instance, the vents 118a and 118b may be adjusted to vary the volume flow rate of cooling fluid supplied to the cool aisles 120.

The air conditioning unit 116 may also vary the amount of cooling fluid supplied to the racks 102–108 as the cooling requirements vary according to the heat loads in the racks 102–108, along with the subsequent variations in the volume flow rate of the cooling fluid. As an example, if the heat loads in the racks 102–108 generally increases, the air conditioning unit 116 may operate to increase the supply and/or decrease the temperature of the cooling fluid delivered into the space 114. Alternatively, if the heat loads in the racks 102–108 generally decreases, the air conditioning unit 116 may operate to decrease the supply and/or increase temperature of the cooling fluid. In this regard, the amount of energy utilized by the air conditioning unit 116 to generally maintain the components in the room 100 within predetermined operating temperature ranges may substantially be optimized.

Through operation of the vents 118a and 118b and the air conditioning unit 116, global and zonal control of the cooling fluid flow and temperature may be achieved. For instance, the vents 118a and b generally provide localized or zonal control of the cooling fluid flow to the racks 102–108. In addition, the air conditioning unit 116 generally provides global control of the cooling fluid flow and temperature throughout various portions of the room 100. By virtue of the zonal and global control of the cooling fluid, the amount of energy consumed by the air conditioning unit 116 in maintaining the components of the racks 102–108 within predetermined operating temperature ranges may substantially be reduced in comparison with conventional room cooling systems.

In FIG. 1, a robotic device 128 is depicted as being located between racks 106 and 108. The robotic device 128 contains sensors 130 for detecting one or more conditions in the room 100. The detected conditions may include, for example, sounds, images, environmental conditions (e.g., temperature, pressure, air flow, humidity, location, etc.), etc. In one embodiment, the robotic device 128 may transmit the detected conditions to a user, e.g., a controller external to the robotic device 128, which may be animate or inanimate. The user may rely upon the detected conditions to vary the position and orientation of the robotic device 128. In another embodiment, the robotic device 128 may process the detected conditions and perform certain actions in response to the detected conditions, some of which are described in greater detail hereinbelow.

The robotic device 128 also may contain an interface assembly 132. The interface assembly 132 may comprise circuitry and an interface for mating with the vents, for instance, the vent 118b. In one regard, the robotic device 128 may use the interface assembly 132 to adjust the vent 118b in response to instructions received from a user or to the conditions detected by the sensors 130. The robotic device 128 may sense and transmit environmental condition information to an air conditioning unit controller (not shown) which may utilize the information in determining delivery of cooling fluid to the racks 102–108 in the room 100. In addition, the robotic device 128 may transmit the environmental condition information to a central controller 134 configured to control vents, for instance, the vent 118a.

Figure 2A:
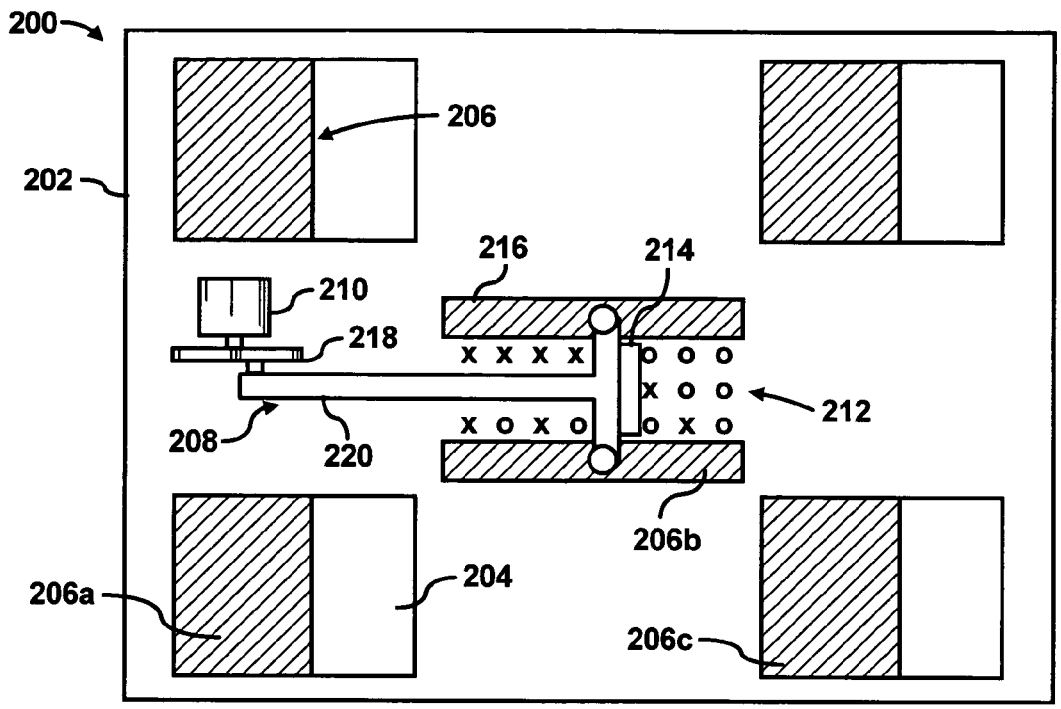
FIG. 2A shows a simplified schematic illustration of a vent assembly in accordance with an embodiment of the invention.

With reference to FIG. 2A, there is shown a simplified schematic illustration of a vent assembly 200 in accordance with an embodiment of the invention. The vent assembly 200 may comprise the vents 118a and 118b and generally includes a frame 202 having a plurality of openings 204 configured to allow the flow of fluid through the vent assembly 200. The openings 204 are illustrated as being partially blocked by a damper 206, shown as a plurality of damper components 206a–206c. As depicted in FIG. 2A, the damper 206 may comprise one or more movable plates interconnected and movable through a single linkage 208.

The damper 206 may be slidably or rotationally attached to the vent assembly 200 in any reasonably suitable known manner.

In the vent assembly 200, the linkage 208 is shown as being centrally located with respect to the openings 204. However, it should be understood that the linkage 208 may be positioned at any reasonably suitable location with respect to the openings 204 without departing from the scope of the invention. In addition, four openings 204 and one damper 206 are shown in FIG. 2A for purposes of illustration and simplicity of description and are not meant to limit the invention in any respect. Instead, the vent assembly 200 may include any number of openings 204 and dampers 206 without departing from the scope of the invention.

The linkage 208 is illustrated as being attached to the damper 206 on one end thereof through an opening 216 in the frame 202 and to a motor 210, for instance, a DC motor, on the opposite end thereof. In its simplest form, the linkage 208 comprises a mechanical system for converting rotary input to lateral output. In this manner, the linkage 208 may be attached to the motor 206 to cause the linkage 208 to move in a lateral direction through rotary movement of the motor 210. More particularly, the linkage 208 may include a disk 218 and an arm 220 in which the arm 220 is attached at a location of the disk 218 that is offset from the center of the disk 218. This type of configuration generally causes the arm 220 to move in one lateral direction or the other depending upon the rotational position of the motor 210 and the disk 218. A more detailed description of the linkage 208 assembly and operation is set forth below with respect to FIG. 2C.

As also shown in FIG. 2A, a plurality of markings or a position code 212 is included on the surface of the frame 202. The position code 212 generally comprises a series of machine-readable indicia that may be employed to determine the position of the damper 206. The position code 212 is represented as "x's" and "o's" to generally illustrate that each column of "x's" and "o's" represents a different position along the position code 212 as described in greater detail hereinbelow. It should therefore be understood that the position code 212 may comprise any number of various types of indicia without departing from the scope of the invention. In general, however, the position code 212 may comprise a series of markings, which denote various positions of the damper 206. As other examples, the position code 212 may comprise, barcodes, color codes, indentations, reflective materials, etc. The position code 212 may be printed or formed directly onto the surface of the frame 202 or the position code 212 may be printed or formed on a label and adhered or otherwise attached to the frame 202.

A sensor 214 may be positioned to move with the damper 206 and to read the position code 212. In this regard, the sensor 214 may be attached to the linkage 208 as depicted in FIG. 2A. It should, however, be understood that the sensor 214 may be attached in any number of ways to generally enable the position code 212 to be read. For instance, the sensor 212 may be attached to the damper 206 and thus may move along with the damper 206.

The sensor 214 may comprise a conventional optical scanner or the sensor 214 may comprise a conventional mechanical scanner. The selection of the sensor 214 may be based upon the type of indicia implemented as the position code 212 and vice versa. For instance, if the position code 212 comprises a series of black and white marks, the sensor 214 may comprise a relatively simple device configured to detect two conditions. As another example, if the position code 212 comprises a barcode, the sensor 214 may comprise an optical barcode scanner. Alternatively, if the position code 212 comprises indentations or some form of indicia identifiable through physical contact, the sensor 214 may comprise a mechanical scanner configured to, for instance, traverse the position code 212 and detect physical changes in the position code 212 to determine the position of the damper 206. In any respect, the sensor 214 may be configured to detect the position of the damper 206 through scanning of indicia contained in the position code 212.

Figure 2B:
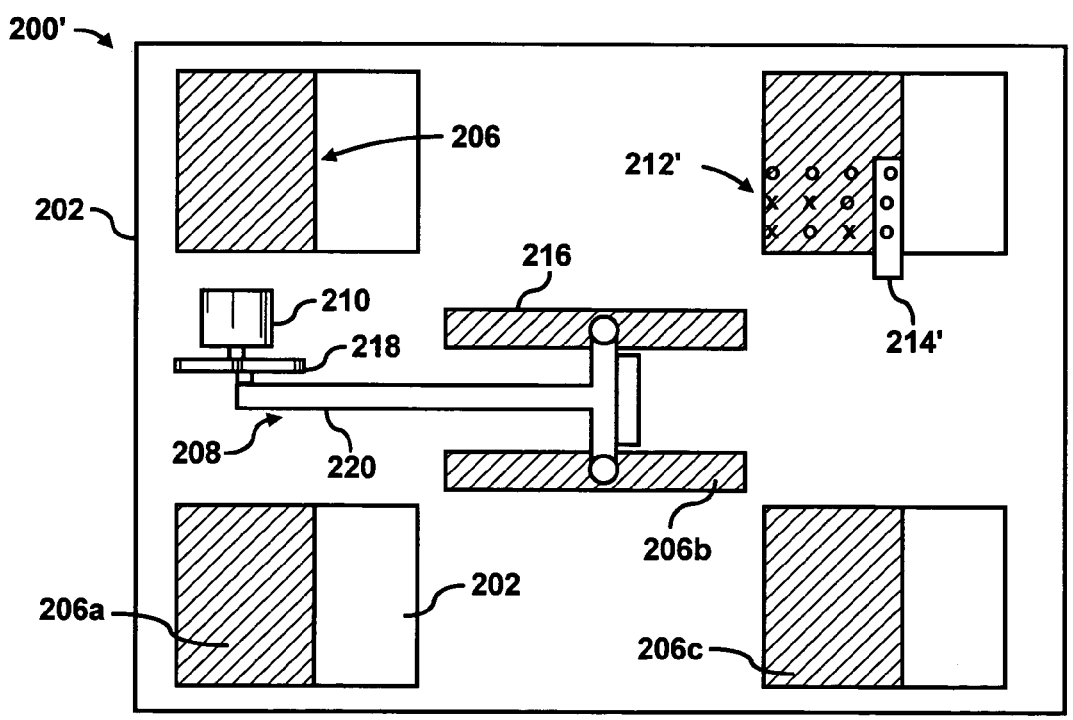
FIG. 2B shows a simplified schematic illustration of the vent assembly of FIG. 2A according to another embodiment of the invention.

FIG. 2B shows a simplified schematic illustration of the vent assembly 200 of FIG. 2A according to another embodiment of the invention. The vent assembly 200' depicted in FIG. 2B is similar to the vent assembly 200 and thus contains many of the features described with respect to the vent assembly 200. The major distinction from the vent assembly 200 is that in the vent assembly 200', a position code 212', which is similar to the position code 212, is provided on a portion of the damper 206. In this regard, as the position of the damper 206 changes, so too does the position of the position code 212'. Therefore, a stationary sensor 214', which is similar to the sensor 214, may operate to determine the position of the damper 206 by reading the indicia on the position code 212'. Although the position code 212' is illustrated as being positioned on a surface of the damper 206 that faces the frame 202, the position code 212' may be positioned on a surface of the damper 206 that does not face the frame 202. For instance, the position code 212' may be positioned on a surface of the damper 206 that faces away from the frame 202. In this instance, the stationary sensor 214' may also be positioned on an opposite side of the frame 202 to thus detect the position code 212'.

In the vent assemblies 200, 200', relative movement between the position code 212, 212' and the sensor 214, 214' is detected regardless of whether the position code 212, 212' is re-positioned with respect to the sensor 214, 214' or vice versa. Through a determination of the position code 212, 212' within the range of the sensor 214, 214', the position of the damper 206 may determined to determine the size of the openings 204.

Figure 2C:
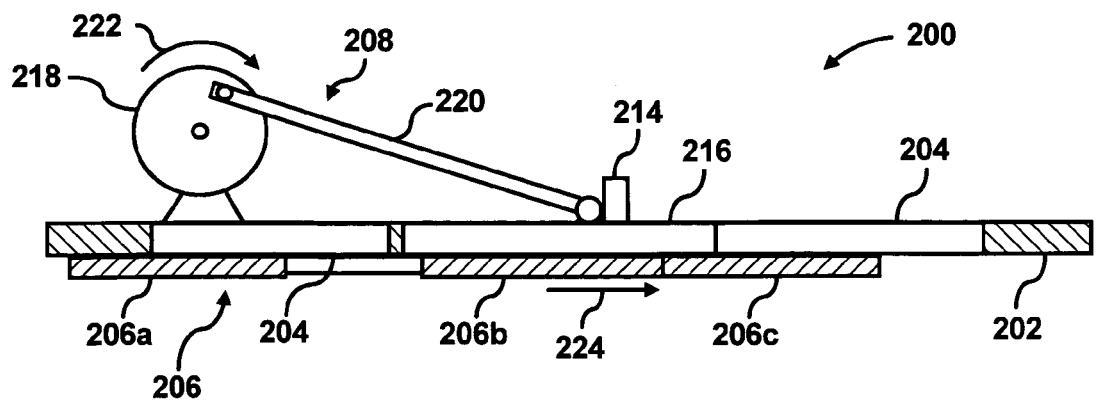
FIG. 2C illustrates a simplified cross-sectional side elevational view of the vent assembly of FIG. 2A, according to an embodiment of the invention.

Reference is now made to FIG. 2C, which illustrates a simplified cross-sectional side plan view of the vent assembly 200 of FIG. 2A, according to an embodiment of the invention. Although the vent assembly 200 is illustrated in a relatively simple form, it should be readily understood that the vent assembly 200 may include additional components and that existing components may be re-arranged or removed without departing from the scope of the invention. For instance, the vent assembly 200 may include additional components for enabling the vent assembly 200 for attachment to spaces in the plenum, for instance. As another example, the linkage 208 and the motor 210 may be positioned on an underside of the frame 202, such that, when the vent assembly 200 is installed in a room, for instance, the room 100, the components of the vent assembly 200 do not substantially obtrude into the aisles between the racks 102–108. In addition, although specific reference is made to the vent assembly 200 depicted in FIG. 2A, the features described with respect to the vent assembly 200 may also apply to the vent assembly 200' depicted in FIG. 2B.

As shown, the damper 206 may be formed by separate damper components 206a–206c. The damper components 206a–206c are also depicted as being movable together. That is, as the damper component 206b, which is attached to an end of the linkage 208 through the opening 216, moves, the damper components 206a and 206c also move in the same direction as the damper component 206b. In this regard, as the linkage 208 moves, the sizes of the openings 204 vary.

As shown in greater detail in FIG. 2C, the arm 220 of the linkage 208 is rotatably attached to the disk 218. Thus, as the disk 218 is caused to rotate in a clockwise direction as indicated by the arrow 222, the damper components 206a–206c are caused to move in a lateral direction as indicated by the arrow 224. Thus, through rotation of the disk 218 by the motor 210 in a single direction, for instance, in the clockwise direction as indicated by the arrow 222, the damper components 206a–206c may be caused to move in either lateral direction with respect to the frame 202. In this regard, through implementation of the linkage 208 configuration depicted in FIG. 2C, a relatively inexpensive, unidirectional motor may be employed to move the damper components 206a–206c to either increase or decrease the size of the openings 204. Alternatively, the motor 210 may comprise a bi-directional motor or may otherwise be configured to rotate in two directions. Although bi-directional motors may be relatively more expensive than uni-directional motors, the bi-directional motors may afford greater response times to reach desired damper component 206a–206c positions since it is unnecessary with bi-directional motors to reach either the fully open or fully closed positions prior to movement in alternating lateral directions.

Although a particular actuating configuration has been depicted in FIG. 2C, it should be understood that any reasonably suitable configuration for actuating the damper 206 may be implemented without departing from the scope of the invention. Examples of other suitable actuating configurations for the damper 206 are depicted in FIGS. 2D–2I.

Figure 2D:
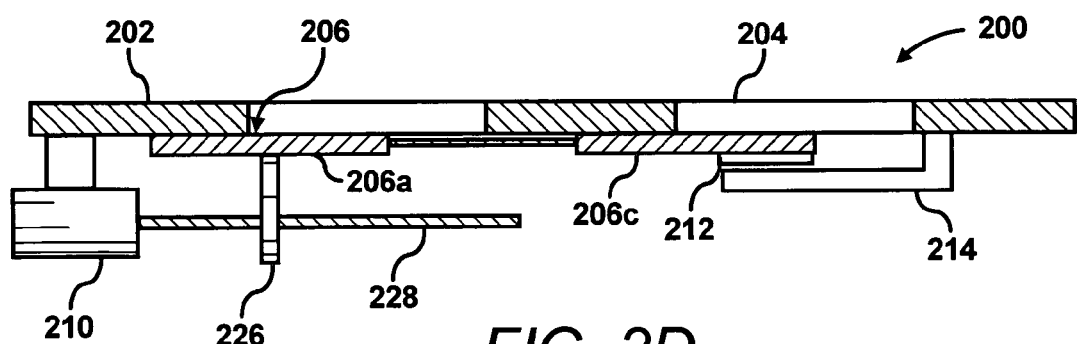
FIG. 2D illustrates a simplified cross-sectional side elevational view of the vent assembly of FIG. 2A, according to another embodiment of the invention.

FIG. 2D illustrates a simplified cross-sectional side elevational view of the vent assembly 200 of FIG. 2A, according to another embodiment of the invention. In comparison with the vent assembly 200 illustrated in FIG. 2C, the vent assembly 200 depicted in FIG. 2D includes a different arrangement for actuating the damper 206. In FIG. 2D, the motor 210 is positioned on the same side of the frame 202 as the damper 206. In addition, the actuating mechanism includes a drive link 226 and a drive screw 228 threadably inserted into the drive link 226. The motor 210 may be suspended from the frame 202 to maintain the sliding relationship between the frame 202 and the damper 206. The motor 210 may be suspended by a metal bracket, zip tie, adhesive, or other generally known attachment arrangements.

As shown, the damper 206 overlap the back of the frame 202 to occupy a partially closed position in the openings 204 in the frame 202. The damper components 206a–206d, however, are traversable back and forth to vary the sizes of the openings 204. Also shown is the position code 212 provided on the damper component 206c and a sensor 214 mounted on the frame 202 to enable reading of the position code 212. The sensor 214 may be sized to substantially minimize impedance of airflow through the opening 204. In operation, the motor 210 may receive power which causes the drive screw 228 to rotate. Because the drive screw 228 is threadably inserted into the drive link 226, rotation of the drive screw 228 generally causes the translation of the drive link 226 and the damper 206 in a direction generally parallel with the longitudinal axis of the drive screw 228. Therefore, through operation of the motor 210, the position of the damper 206 may be changed to thereby vary the sizes of the openings 204.

Figure 2E:
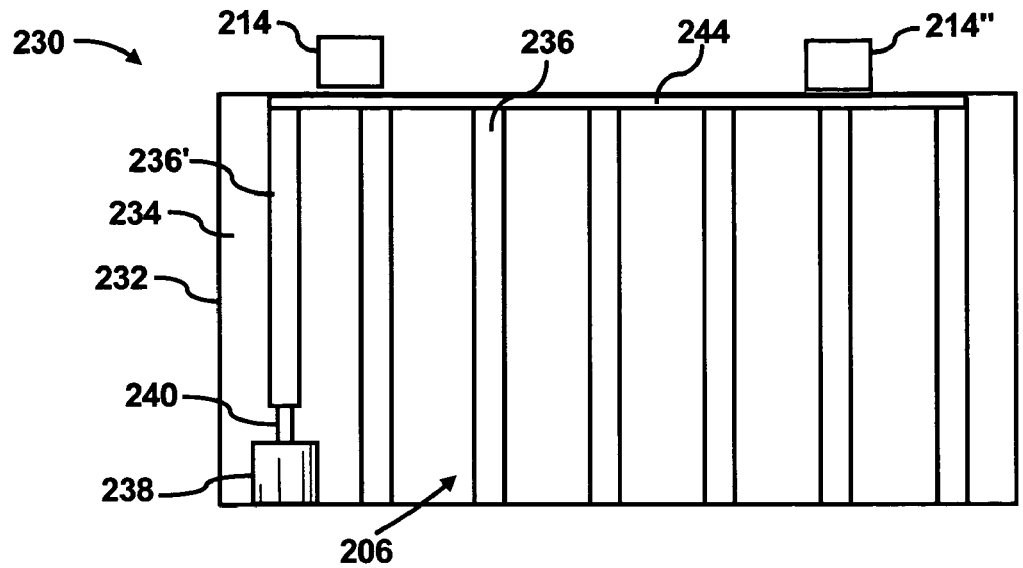
FIG. 2E illustrates a simplified plan view of a vent assembly according to another embodiment of the invention.

FIG. 2E illustrates a simplified plan view of a vent assembly 230 according to another embodiment of the invention. The vent assembly 230 may comprise the vents 118a and 118b and generally includes a frame 232 having an opening 234 configured to allow the flow of fluid through the vent assembly 230. The vent assembly 230 may be constructed from any suitable structural materials, such as: metal, plastics, resin, composite, or the like. The opening 234 may be partially blocked by a damper 206. The damper 206 in the vent assembly 230 generally comprises a plurality of spaced apart vanes 236. A DC motor 238 is controlled by a controller and adjusts the rotation of a primary vane 236' via a drive shaft 240. The DC motor 238 may be rigidly attached to the vent frame 232 in any suitable manner.

Figure 2F:
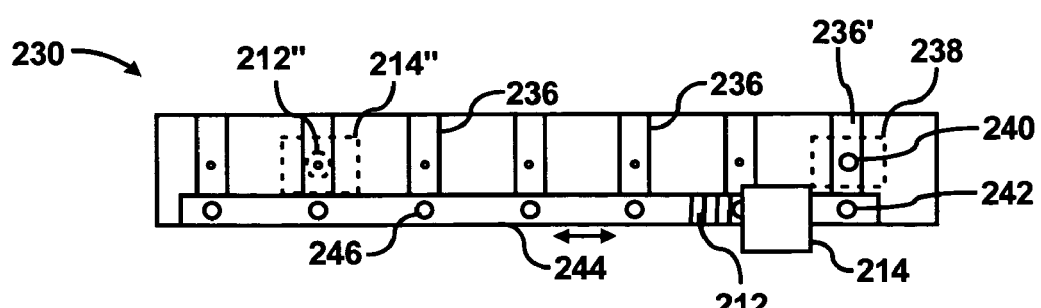
FIG. 2F shows a simplified side elevational view with a wall of the frame of the vent assembly illustrated in FIG. 2E removed, according to an embodiment of the invention.

The drive shaft 240 is rigidly fixed to the primary vane 236' such that rotation of the DC motor 238 and drive shaft 240 results in rotation of the primary vane 236'. As illustrated in FIG. 2F, a drive pin 242 is press fit into the opposite end of the primary vane 236' and is press fit into a transfer bar 244 to interlock the primary vane 236' and transfer bar 244 together. The transfer bar 244 is rotatably attached to all of the other vanes 236 via transfer pins 246. Thus, rotation of the primary vane 236' causes the transfer bar 244 to translate, thereby causing the vanes 236 to pivot about their pivotable mounting axes. Accordingly, flow rate and flow direction of cooling fluid may be adjusted through the vent assembly 230.

As further depicted in FIGS. 2E and 2F, a sensor 214 may be positioned with respect to the vent assembly 230 to detect movement of the vanes 236. More particularly, a position code 212 may be provided on a movable portion of the vent assembly 230, which may be read by the sensor 214. The sensor 214 may be attached to the frame 232 in any reasonably suitable manner. The manners in which the position code 212 and the sensor 214 may operate are similar to those described hereinabove.

Also depicted in FIG. 2F is a position code 212" provided in a circular configuration about a pivot axis of one of the vanes 236. A sensor 214" is also provided to detect movement or rotation of the position code 212" to thereby determine the position of the vanes 236 and the size of the opening 234 in the vent assembly 230. The sensor 214" is illustrated in cross-section to enable viewing of the position code 212". The sensor 214" may be attached to the frame 232 in any reasonably suitable manner. In addition, the position code 212" may comprise any of the position codes 212, 212' described hereinabove and the sensor 214" may comprise any of the sensors 212, 212' described hereinabove. It should be understood that either of the position codes 212, 212" and corresponding sensors 214, 214" may be implemented without departing from a scope of the invention.

Figure 2G:
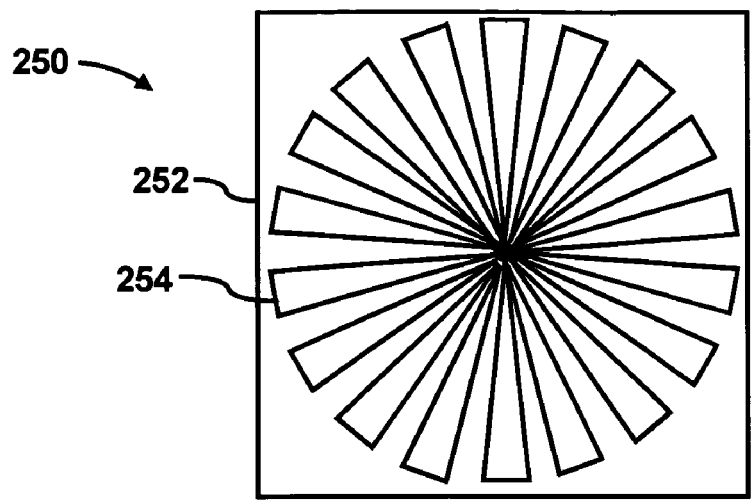
FIG. 2G illustrates a simplified plan view of a vent assembly according to another embodiment of the invention.

FIG. 2G illustrates a simplified plan view of a vent assembly 250 according to another example. The vent assembly 250 may comprise the vents 118a and 118b and generally includes a frame 252 having a plurality of openings 254 configured to allow the flow of fluid through the vent assembly 250. The vent assembly 250 may be constructed from any suitable structural materials, such as: metal, plastics, resin, composite, or the like. The openings 244 may be partially blocked by a damper 256. The damper 256 comprises a plurality of vanes 258 (FIG. 2H) arranged in a similar configuration and complementary to the configuration of the openings 254. As shown, the vanes 258 are in a fully open position.

Figure 2H:
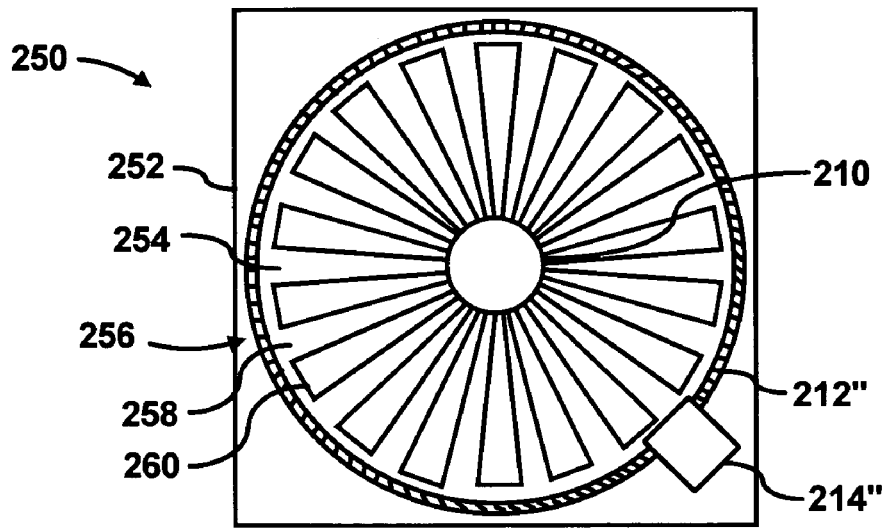
FIG. 2H illustrates a simplified bottom view of the vent assembly depicted in FIG. 2G according to an embodiment of the invention.

FIG. 2H illustrates a simplified bottom view of the vent assembly 250 according to an embodiment of the invention. As shown in FIG. 2H, the damper 256 comprises a circular wheel having a plurality of vanes 258 spaced apart from one another. Located between the vanes 258 are apertures 260. In one regard, the vanes 258 may be formed in the damper 256 by removing material to form the apertures 260. Alternatively, other known manners of forming the vanes 258 may be employed. For instance, the vanes 258 may be molded into the damper 256. The vanes 258 may be sized to vary airflow through the openings 254 between and including fully open and fully closed positions. The damper 256 is therefore rotatable with respect to the frame 252 through operation of a motor 210.

The position of the damper 256 may be detected through reading of position codes 212", which are illustrated as being provided along the edge of the damper 256. Also illustrated is a sensor 214" positioned to read the position code 212". As shown, the position codes 212" are provided along the entire circumference of the damper 256. Therefore, a uni-directional motor 210 may be implemented to cause the damper 256 to rotate in a single direction with respect to the frame 252. Alternatively, however, a bi-directional motor 210 may also be implemented without departing from a scope of the invention. If a bi-directional motor 210 is implemented, the position codes 212" may be positioned substantially only in an area of the damper 256 readable by the sensor 214". Regardless of the type of motor 210 implemented, the position code 212" may also be provided at various other locations of the damper 256.

Alternatively, the sensor 214" may be positioned on the damper 256 and the position code 212" on the frame 252 without departing from a scope of the invention.

Figure 2I:
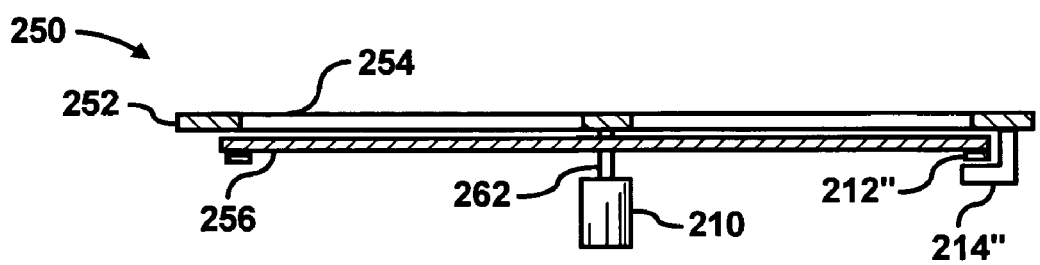
FIG. 2I shows a side elevational view of the vent assembly depicted in FIG. 2G, partially in cross-section, according to an embodiment of the invention.

With reference now to FIG. 2I, there is shown a side view of the vent assembly 250, partially in cross-section, according to an embodiment of the invention. As shown in FIG. 2I, the damper 256 is mounted to the motor 210 via a drive link 262. Thus, as the motor 210 operates, the damper 256 is caused to rotate. In addition, the position of the damper 256 may be detected through reading of the position codes 212" by the sensor 214".

Figures 3A, 3B:
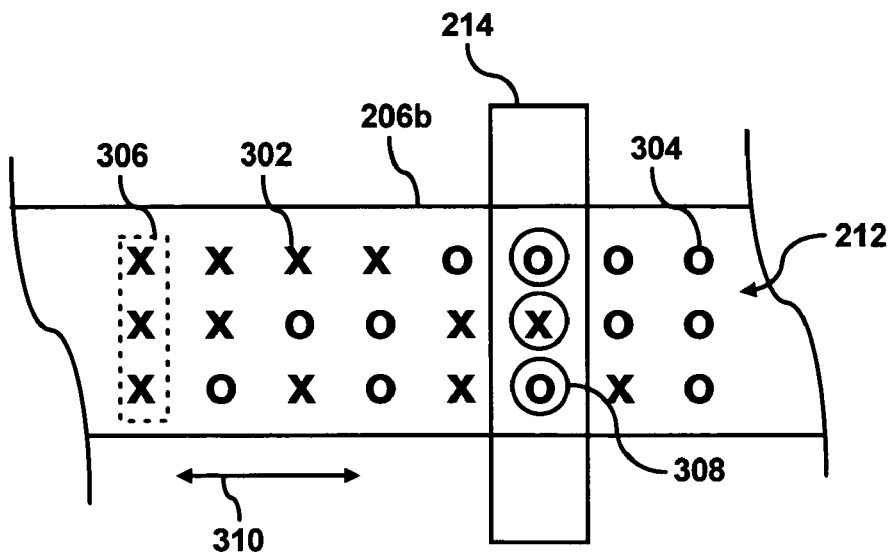
FIG. 3A shows a simplified schematic illustration of the position code and the sensor according to an embodiment of the invention.
FIG. 3B shows a table correlating various configurations of the marks and spaces and their related values, according to an embodiment of the invention.

With reference now to FIG. 3A, there is shown a simplified schematic illustration of the position code 212 and the sensor 214 according to an embodiment of the invention. As depicted in FIG. 3A, the position code 212 comprises a plurality of marks 302, denoted as "x's", and spaces 304, denoted as "o's", arranged in a matrix of three rows and eight columns. The depiction of three rows and eight columns is for purposes of illustration only and is not intended to limit the invention in any respect. Instead, the position code 212 may include any reasonably suitable number of columns and rows, which may defined according to, for instance, the level of resolution desired in controlling the damper movement. In FIG. 3A, the damper component 206b is illustrated. In addition, the marks 302 and spaces 304 may be replaced with any of the indicia described hereinabove.

Each column includes a set of marks 302 or spaces 304 denoting a position within the position code 212. The sets of marks 302 and spaces 304 may generally denote a binary code system. Thus, for instance, the marks 302 may represent "1's" and the spaces 304 may represent "0's", or vice versa. In any respect, the combinations of the "1's" and "0's" may correspond to different values as described with respect to FIG. 3B. In FIG. 3A, the column labeled 306 includes three marks 302 and may correspond to a position "1 1 1" within the position code 212. In the example shown in FIG. 3A, the sensor 214 includes three optical sensors 308 each overlying a row of the position code 212. As the sensor 214 or the damper component 206b moves relative to each other as described hereinabove, each optical sensor 308 may overlie one of the rows such that each mark 302 or space 304 in a column 306 may be addressed. In this regard, the sensor 214 may detect the arrangement of the marks 302 and spaces 304 to determine the value that the marks 302 and spaces 304 represent.

According to another example, if, for instance, the marks 302 and spaces 304 comprise barcodes, the sensor 214 may comprise a single optical sensor 308. In this case the optical sensor 308 may comprise a barcode reader. In yet another example, the marks 302 or spaces 304 may comprise indentations and the sensor 214 may comprise a mechanical device configured to detect the locations of the indentations and relatively flat sections. In this case, the positions of the indentations may be detected to determine a value that the marks 302 and spaces 304 represent. In any event, the position of the damper 206 may be determined through a determination of the position values as described in FIG. 3B.

In FIG. 3B, there is shown a table 350 correlating various configurations of the marks 302 and spaces 304 and their related values, according to an embodiment of the invention. As shown, a first side of the table 350 indicates the various configurations of the marks 302 and spaces 304 in position code 212 having a 3×8 matrix. A second side of the table 350 indicates the degrees to which the openings 204 are open correlating to the configurations of the marks 302 and spaces 304. The second side of the table 350 may indicate the degrees to which the openings 204 are closed by flipping the order of the entries.

In any respect, each position 352a–352h read by the sensor 214 correlates to a respective damper position 354a–354h. More particularly, for instance, the "000" position 352a corresponds to the damper 206 being in the fully closed position 354a while the "111" position code 352h corresponds to the damper 206 being in the fully open position 354h. An another example, when the sensor 214 overlies the position code 212 as shown in FIG. 3A, the optical sensors 308 read the position as "010." In the table 350, the "010" position 352c corresponds to the damper position 354c which correlates to the damper 206 being $2/7^{th}$ open. By reading the columns within the position code 212, the damper position 354a–354h may be determined through implementation of the table 350.

The table 350 may be represented as a look up table, a database table, an algorithm, or the like. The table 350 may also be used to determine a target position of the damper 206 once it is determined how much the damper 206 should be opened. For example, if it is determined that the damper 206 should be $2/7^{th}$ open, the target position will be equal to the damper position 354c represented as "010" in the position code 212. In this regard, the damper 206 may be re-positioned to the desired position as described hereinabove.

Figure 4A:
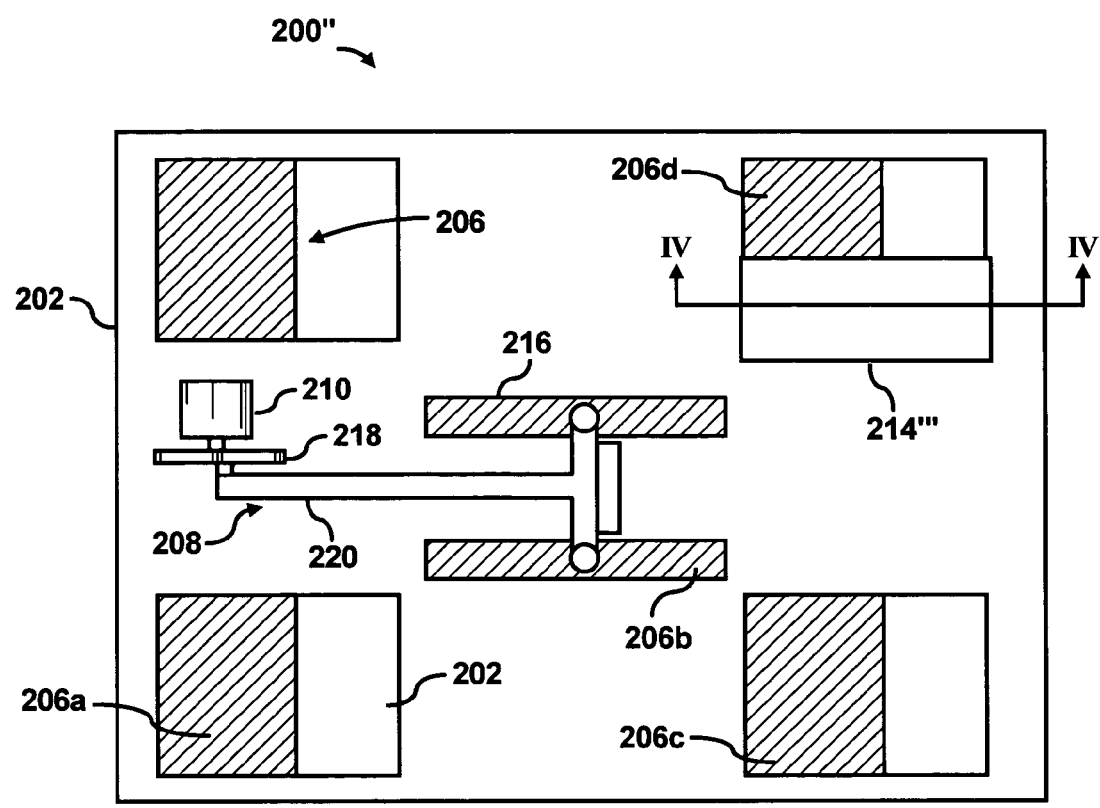
FIG. 4A shows a simplified schematic illustration of the vent assembly of FIG. 2B according to another embodiment of the invention.

FIG. 4A shows a simplified schematic illustration of the vent assembly 200' of FIG. 2B according to another embodiment of the invention. The vent assembly 200" depicted in FIG. 4A is similar to the vent assembly 200' and thus contains many of the features described with respect to the vent assembly 200'. The major distinction from the vent assembly 200' is that in the vent assembly 200", the position code 212' is omitted. Instead, an optical sensor 214''' is positioned to detect the position of the damper 206. More particularly, as shown in FIG. 4A, the optical sensor 214''' is configured and positioned to detect the position of a damper component 206d. In this regard, the optical sensor 214'' is configured as a stationary sensor. However, the optical sensor 214'' may also be positioned on the damper component 206d and may be configured to detect movement of the damper component 206d with respect to a portion of the frame 202.

Figure 4B:
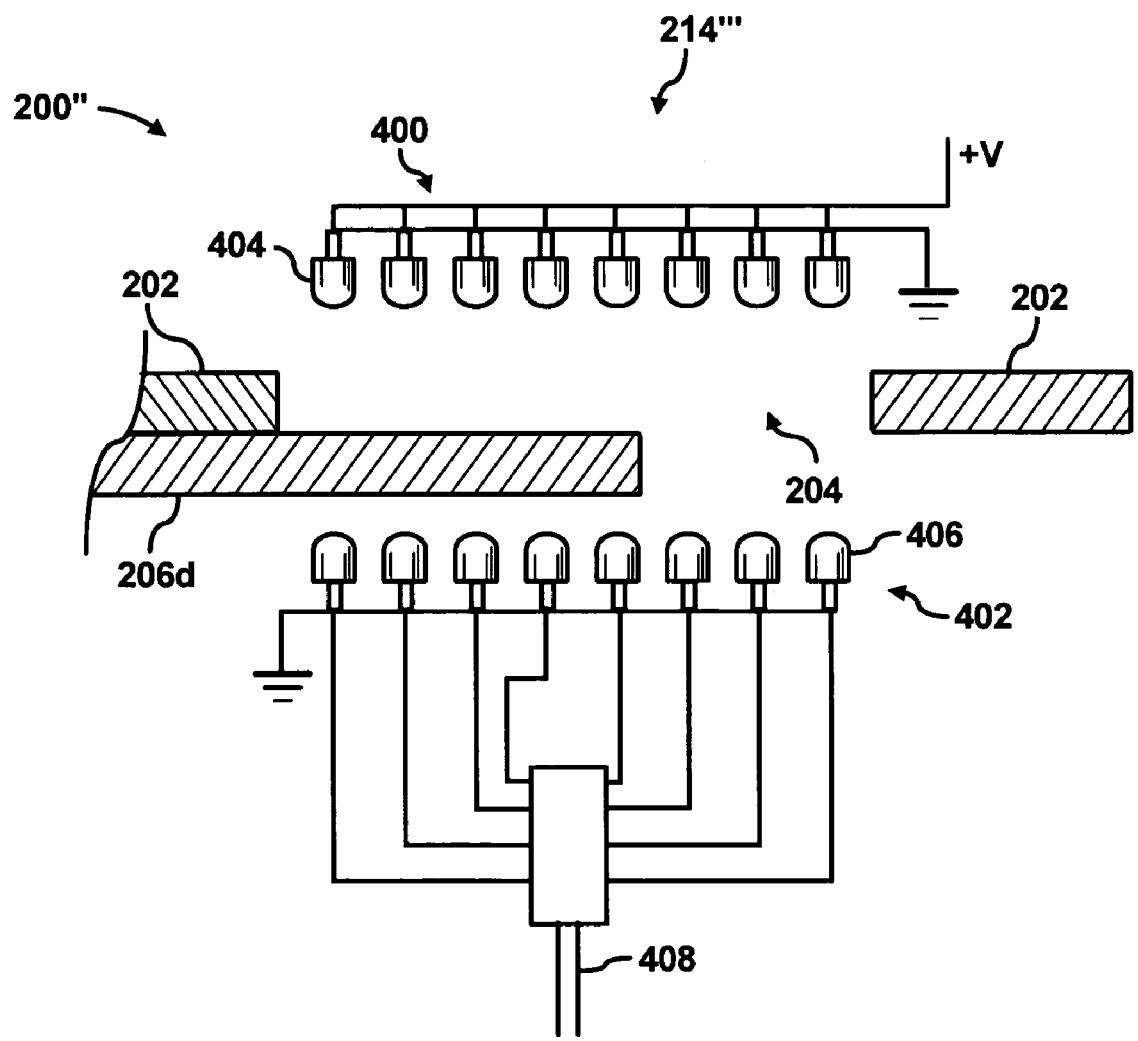
FIG. 4B shows an enlarged cross-sectional simplified schematic side view of the optical sensor and the damper component taken along line IV—IV of FIG. 4A, according to an embodiment of the invention.

With reference to FIG. 4B, there is shown an enlarged cross-sectional simplified schematic side view of the optical sensor 214''' and the damper component 206d taken along line IV—IV of FIG. 4A, according to an embodiment of the invention. As shown in FIG. 4B, the optical sensor 214''' comprises an array of light emitting diodes (LEDs) 400 and an array of light receiving diodes (LRDs) 402. The array of LEDs 400 is illustrated as including eight LEDs 404 and the array of LRDs 402 is illustrated as including eight LRDs 406. In this regard, the optical sensor 214''' has an eight bit resolution since eight different positions may be determined.

In operation, power is supplied to both the LED 400 array and the LRD 402 array. As the names suggest, the LEDs 404 are configured to emit a light in a direction of respective LRDs 406. The LRDs 406 are configured to receive the light emitted by their respective LEDs 404. The LEDs 404 and the LRDs 406 may comprise any reasonably suitable conventional devices configured to perform these functions.

Figure 4C:
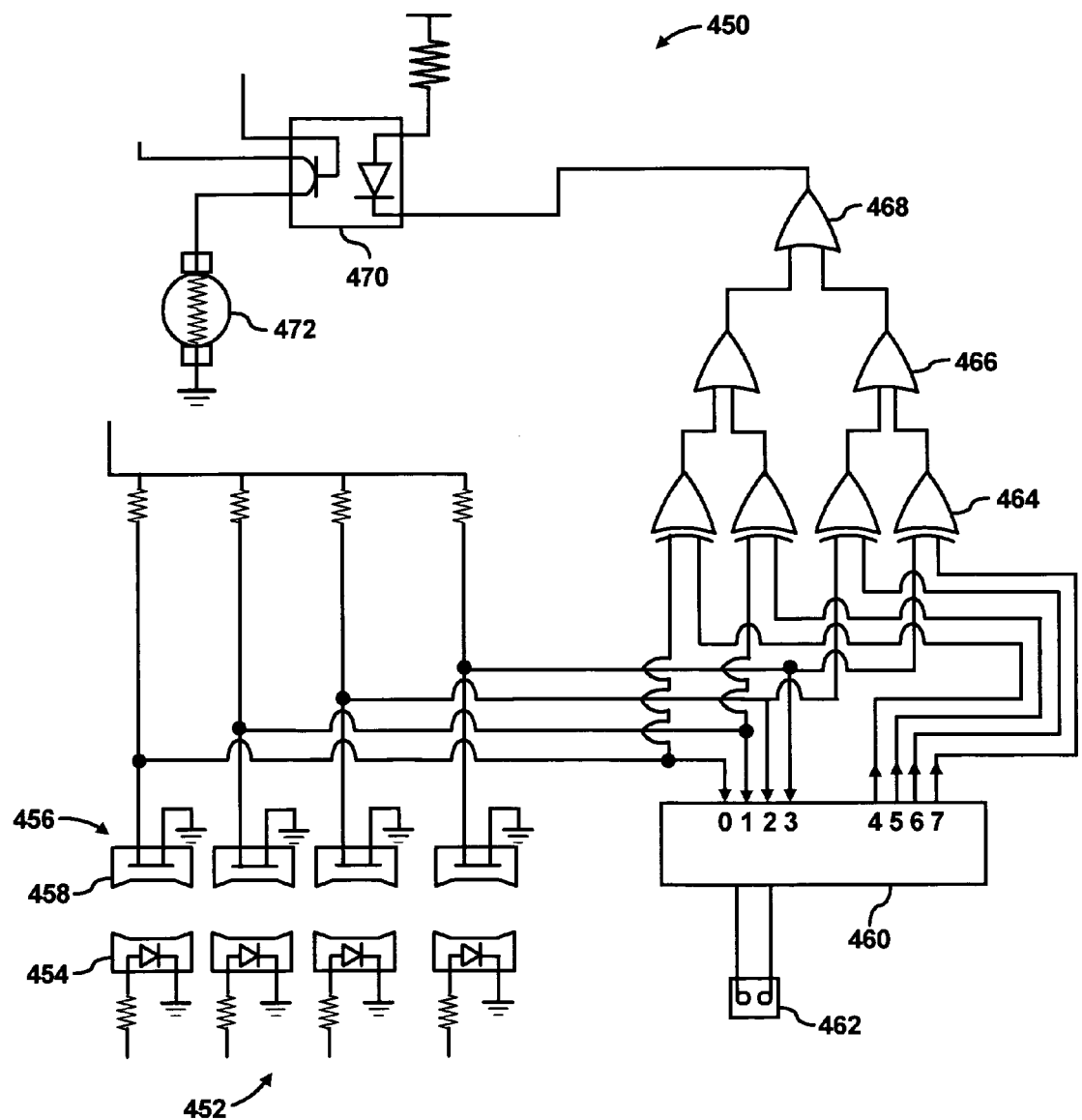
FIG. 4C illustrates a schematic circuit diagram of an optical sensor according to another embodiment of the invention.

The damper component 206d is configured to block the transmission of light from the LEDs 404 to the LRDs 406. A controller may determine whether the light emitted from the LEDs 404 is being blocked by the damper component 206d to determine the position of the damper component 206d. Alternatively, a logic circuit, for instance, as shown in FIG. 4C may be implemented to determine the position of the damper component 206d. More particularly, the position of the damper component 206d may be determined based upon the number of light transmissions being blocked by the damper component 206d. Thus, if none of the light transmissions are blocked, the opening 204 is considered as being fully open. And, if all of the light transmissions are blocked, the opening 204 is considered as being fully closed. As an example, and as shown in FIG. 4B, the light emitted from the first five LEDs 404 is blocked by the damper component 206d. This correlates to the damper component 206d being $5/7^{th}$ closed.

According to an example, the LED array 400 and the LRD array 402 may be connected to each other, a power source and a controller through a ONE WIRE scheme 408 available from DALLAS SEMICONDUCTOR of Dallas, Tex. or MAXIM INTEGRATED PRODUCTS, Inc. of Sunnyvale, Calif. Under the ONE WIRE scheme, control and signaling are supplied through a double wire connection, one for ground and the other for control and signaling. Alternatively, the supply of control and signals to the LED array 400 and the LRD array 402 may be performed through any number of wires and with any reasonably suitable controller. In addition, the power source may comprise batteries, for instance, lithium batteries, or it may comprise an alternating current power source.

FIG. 4C illustrates a schematic circuit diagram 450 of a vent tile controller according to an embodiment of the invention. In FIG. 4C, an array 452 of four LEDs 454 and an array 456 of four LRDs 458 are illustrated for simplicity of description purposes. Therefore, it should be understood that the principles denoted in FIG. 4C may be applied to optical sensors having any number of LEDs 454 and LRDs 458, without departing from a scope of the invention. In this regard, the schematic circuit diagram 450 may be implemented in optical sensors having any reasonably suitable resolution.

As shown, an array of LEDs 452 are aligned with an array of LRDs 456, which are configured to operate as described hereinabove, for instance, with respect to FIG. 3A. The LED array 452 and the LRD array 456 are each connected to a power source and ground as shown. In addition, the LRDs 458 of the LRD array 456 are connected to an addressable switch 458. A suitable addressable switch 460 may comprise the DS2408 available from DALLAS SEMICONDUCTOR/MAXIM. In the diagram 450, a 4 bit position code is employed for determining 16 possible positions. In operation, a goal position may be set and the current position may be read over a 1-wire interface. A single external control system (not shown), for instance, a TINI board (available from DALLAS SEMICONDUCTOR/MAXIM) or a computer system may control a relatively large number of vent tiles through the 1-wire interface. The control system may transmit a 4 bit position code of the desired opening to the addressable switch 460. The control system may determine the actual position of the damper by reading the other 4 bits of the addressable switch 460. The actual position may be used to determine when the damper has reached the desired position, or to detect malfunctioning vent tiles.

The LEDs 454 include current limiting resistors which operate to illuminate the position code indicia. In addition, the LRDs 458, include components that are operable to detect two distinct states, for instance, phototransistors, reflective optical sensors, and the like. The LEDs 454 and the LRDs 458 may also comprise a composite structure, such as, for instance, optointerruptors. The output of each sensor of the LRDs 458 goes to the addressable switch 460 and to logic gates 464–468. The logic gates 464 may comprise Exclusive OR gates, for instance, a 74LS86 chip. The logic gates 466 and 468 may comprise OR gates, for instance, a 74LS32 chip.

The addressable switch 460 may comprise a DS2408 1-wire 8 bit bi-directional I/O port. The addressable switch 460 generally enables communication to the control system. More particularly, bits 0–3 are used as inputs and report the values read by the position sensors. These values may be queried by the external control system to determine the actual position of the damper. Bits 4–7 are configured as outputs and are used to set the position goal for the damper. In addition, bits 4–7 may be set by the external control system to the values corresponding to the desired damper position. The bits 4–7 are connected to the logic gates 464 as depicted in FIG. 4C. The addressable switch 460 is generally configured to indefinitely maintain the output signals once they are set and to report input signals when querried by the external controller. In addition, the addressable switch 460 is powered through a power supply (not shown) and includes a 1-wire connection 462 with a ground and a signal connection.

In operation, the logic gates 464 detect a difference between the sensed position code and the externally set position goal. As shown, the diagram 450 includes four Exclusive OR gates 464, which may be implemented in a 74LS86 chip. In the Exclusive OR gates 464, if both inputs, that is, from the LRDs 458 and the addressable switch 460, are the same, the output is low. The output is low regardless of whether both inputs were low or high. If the inputs differ, the output is high. Therefore, Exclusive OR gates 464 compare one bit of the sensed position with one bit of the target position and output a high value if a sensed bit differs from its target.

The logic gates 466 are illustrated as comprising standard OR gates and may be implemented in one-half of a 74LS32 chip, for instance. The logic gates 466 are configured to receive signals from the Exclusive OR gates 464 as also shown in the diagram 450. More particularly, each of the OR gates 466 is configured to receive the results of the comparisons made by the Exclusive OR gates 464. If either or both of the inputs from the Exclusive OR gates 464 is high, then the output of the respective OR gate 466 is high. If either or both of the results from the comparisons performed by the Exclusive OR gates 464 differ, then a high value is output. In addition, if both of the results from the comparisons performed by the Exclusive OR gates 464 are low, then a low value is output by the respective OR gate 466.

The logic gate 468 is illustrated as also comprising a standard OR gate, which may be implemented in one-quarter of a 74LS32 chip, for instance. As shown, the OR gate 468 is configured to receive results of the OR gates 466 as inputs. In addition, the OR gate 468 is configured to compare the results received from the OR gates 466. If either or both of the OR gates 466 outputs a high value, then the OR gate 468 outputs a high value. In this respect, any difference between the sensor inputs and their corresponding targets will generate a high output from the OR gate 468. Thus, a low output may only be generated if all four sensed bits match their targets.

Also illustrated in FIG. 4C is a solid state relay 470, which may comprise an optically isolated high current switch. The solid state relay 470 generally operates by becoming activated and providing current to a motor 472 if the logic detects a difference between the sensed position and the goal or target position. In other words, if the solid state relay 470 receives a low output value from the OR gate 468. The motor 472 may comprise the motor 210 described hereinabove. Once the solid state relay 470 supplies power to the motor 472, power may be continuously supplied to the motor 472 until the sensed values match the target values and the logic circuit deactivates the solid state relay 470. In which case the damper would be in the desired position.

An optional electric brake may also be included for the motor 472 operation. The electric brake may be employed, for instance, if the motor 472 "coasts" substantially after power supply to the motor 472 is discontinued. In one regard, coasting of the motor 472 may cause the damper to coast through the desired target position.

Figure 5:
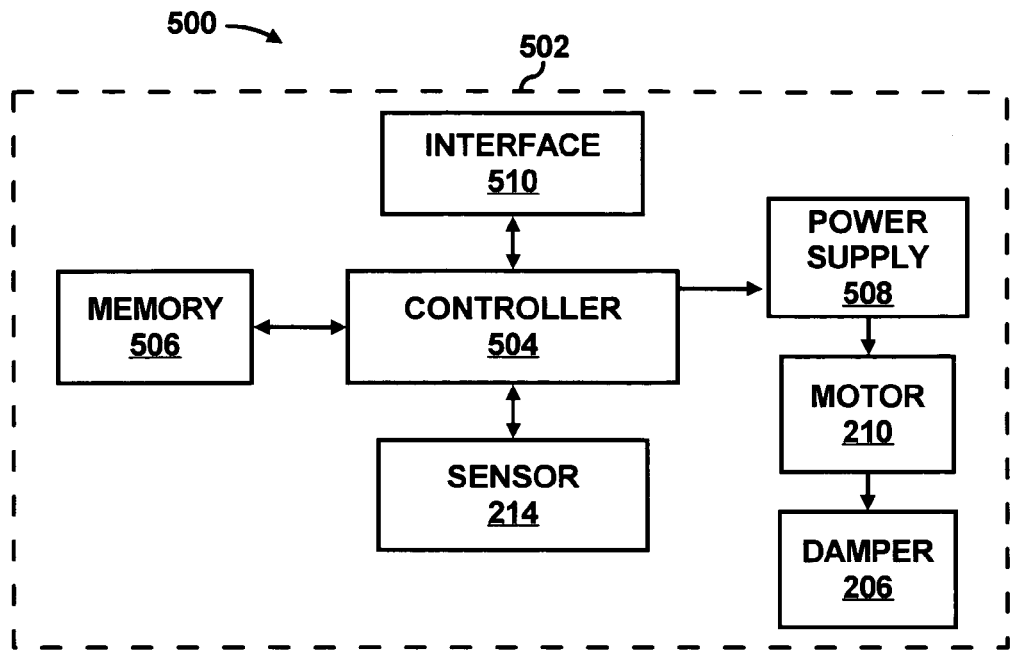
FIG. 5 illustrates a block diagram of a control scheme for an airflow volume varying system, according to an embodiment of the invention.

Referring to FIG. 5, there is illustrated a block diagram 500 of a control scheme for an airflow volume varying system 502, according to an embodiment of the invention. The following description of the control scheme is one manner in which the airflow volume varying system 502 may be operated. In this respect, it is to be understood that the following description of the control scheme is but one manner of a variety of different manners in which such an airflow volume varying system 502 may be operated.

According to this example of the invention, the airflow volume varying system 502 includes a controller 504 and an optional memory 506. The airflow volume varying system 502 also includes a power supply 508 for supplying power to the motor 210 for controlling the movement of the damper 206. The airflow volume varying system 502 also includes an interface 510 for communicating with a central controller, remote device or robotic device. The controller 504 is also connected to the sensor 214, which may also comprise the sensors 214', 214", and 214'". In the following description, however, particular reference is made to the sensor 214 for purposes of brevity.

The controller 504 is generally configured to control operation of the vent assembly 200 by controlling the motor 210 to reposition the damper 206 to thereby vary the size of the openings 204. In this regard, the controller 502 may comprise a microprocessor, a microcontroller, an application specific integrated circuit (ASIC) or the like. In addition, the controller 504 is configured to detect the position of the damper 206 through reading of the position code 212 or through use of the optical sensor 214". The controller 504 may receive instructions to re-position the damper 206 to a target position. To perform the re-positioning of the damper 206, the controller 504 may optionally determine a current position of the damper 206 and compare the current position to the target position. If the current position does not equal the target position, the controller 504 may operate the power supply 508 to vary the operation of the motor 210 to move the damper 206 to the target position.

The optional memory 506 is configured to provide storage of the computer software that provides the functionality of the controller 504. In addition, the memory 506 may store information pertaining to the correlation of various input detected by the sensor 214 to the position of the damper 206. Thus, for instance, the memory 506 may store the table 350 illustrated in FIG. 3B. As another example, the memory 506 may store information pertaining to the position of the damper 206 that correlates to the number of light emissions that fail to reach associated LRDs 406 as described hereinabove. The memory 506 may also be configured to provide storage for holding the target position of the damper 206. The memory 506 may, for instance, be implemented as a combination of volatile and non-volatile memory, such as dynamic random access memory (DRAM), EEPROM, flash memory, and the like.

The memory 506 is considered optional because, as illustrated in FIG. 4C, when logic gates are implemented to perform various functions as described hereinabove, a "latch" in the addressable switch 458 may be implemented to store the target position instead of the memory 506.

The interface 510 may be provided to act as an interface between the controller 504 and a second device, for instance, a central controller, robotic device, etc., configured to transmit the target position of the damper 206 to the controller 504. In another example of the invention, the interface 510 may be configured to route power to the controller 504 and to the motor 210. In this example, the power supply 506 may be omitted since the controller 502 may route power to the motor 210 through the interface 510.

Figure 6:
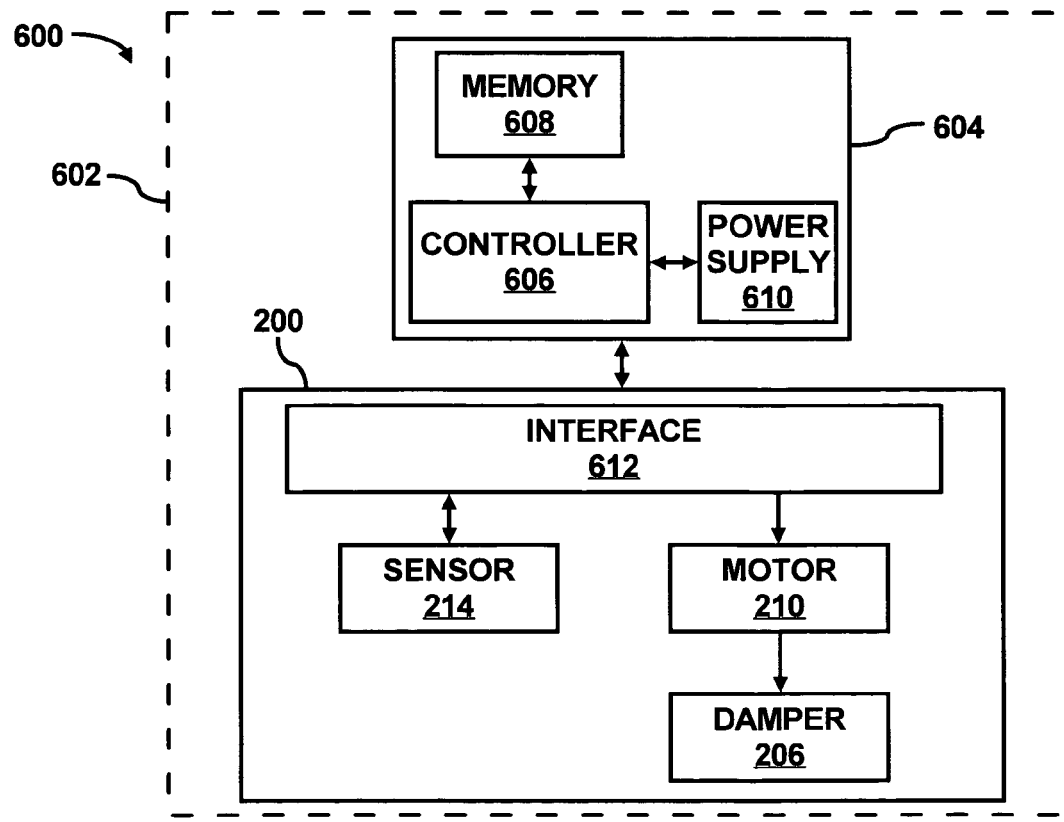
FIG. 6 illustrates a block diagram of a control scheme for an airflow volume varying system, according to another embodiment of the invention.

Referring now to FIG. 6, there is illustrated a block diagram 600 of a control scheme for an airflow volume varying system 602, according to another embodiment of the invention. The following description of the control scheme is one manner in which the airflow volume varying system 602 may be operated. In this respect, it is to be understood that the following description of the control scheme is but one manner of a variety of different manners in which such an airflow volume varying system 602 may be operated.

According to this example, the airflow volume varying system 602 includes a control system 604 that is separate and external to the vent assembly 200. The control system 604 includes a controller 606, an optional memory 608, and a power supply 610, all of which may operate in similar manners as described hereinabove with respect to FIG. 5. The vent assembly 200 is illustrated as including a sensor 214 (or sensors 214', 214", and 214'''), a motor 210 and a damper 206, all of which have been described in greater detail hereinabove. A major distinction between the system 602 and the system 502 is that the control system 604 in the system 602 is separate from the vent assembly 200. In this regard, the control system 604 may comprise, for instance, a central controller, e.g., a computer system configured to control various operations in the room 100, or the robotic device 128 depicted in FIG. 1. The control system 604 may also comprise a hand-held device, for instance, a personal digital assistant, portable computer, etc., having an interface to communicate and transfer information and/or power to the vent assembly 200.

The vent assembly 200 also includes an interface 612 configured to enable communications with the control system 604. The interface 612 may enable wired or wireless communications through any reasonably suitable conventional method. Through the interface 612, the position of the damper 206 as detected by the sensor 214 may be communicated to the control system 604. In addition, the control system 604 may supply power to the motor 210 through the interface to thereby vary the position of the damper 206.

According to an example, if the control system 604 comprises a central controller, for instance, the computer system 134 illustrated in FIG. 1, the interface 612 may comprise a wired communication line 112. In this example, the power supply 610 may be the same power source that is supplied to the central controller. As another example, if the control system 604 comprises a robotic device, for instance, the robotic device 128 depicted in FIG. 1, or another mobile control device, for instance, a hand-held device, the interface 612 may comprise a connector configured to enable a complementary connector to be attached thereto. The complementary connector may be configured on the mobile control device and may be used to interface with the vent assembly 200 as desired. In this case, the power supply 610 may comprise a battery of the mobile control device or it may comprise a separate power source. According to a further example, if the power source is directly connected to the vent assembly 200, information may be transmitted between the mobile control device and the vent assembly 200 through a wireless connection. In this case, the interface 612 may be configured to operate under wireless protocols.

In operation, the control system 604 may be configured to receive a target position for the damper 206 from, for instance, a user, the central controller, etc. The control system 604 may interface with the interface 612 and receive information pertaining to the current position of the damper 206. The control system 604 and more particularly, the controller 606 may determine how the motor 210 is to be operated to maneuver the damper 206 into the target position from the current position. For instance, for a uni-directional motor, the controller 606 may operate the motor 210 to rotate in a single direction which may cause the damper 206 to reach either a fully open or a fully closed position prior to reaching the target position as described hereinabove. As another example, for a bi-directional motor, the controller 606 may determine which direction the motor is to turn to cause the damper 206 to reach the target position as also described hereinabove. In any event, the controller 606 may cause power to be supplied from the power supply 610 to the motor 210 to cause the motor 210 to rotate and re-position the damper 206 into the target position.

Figure 7:
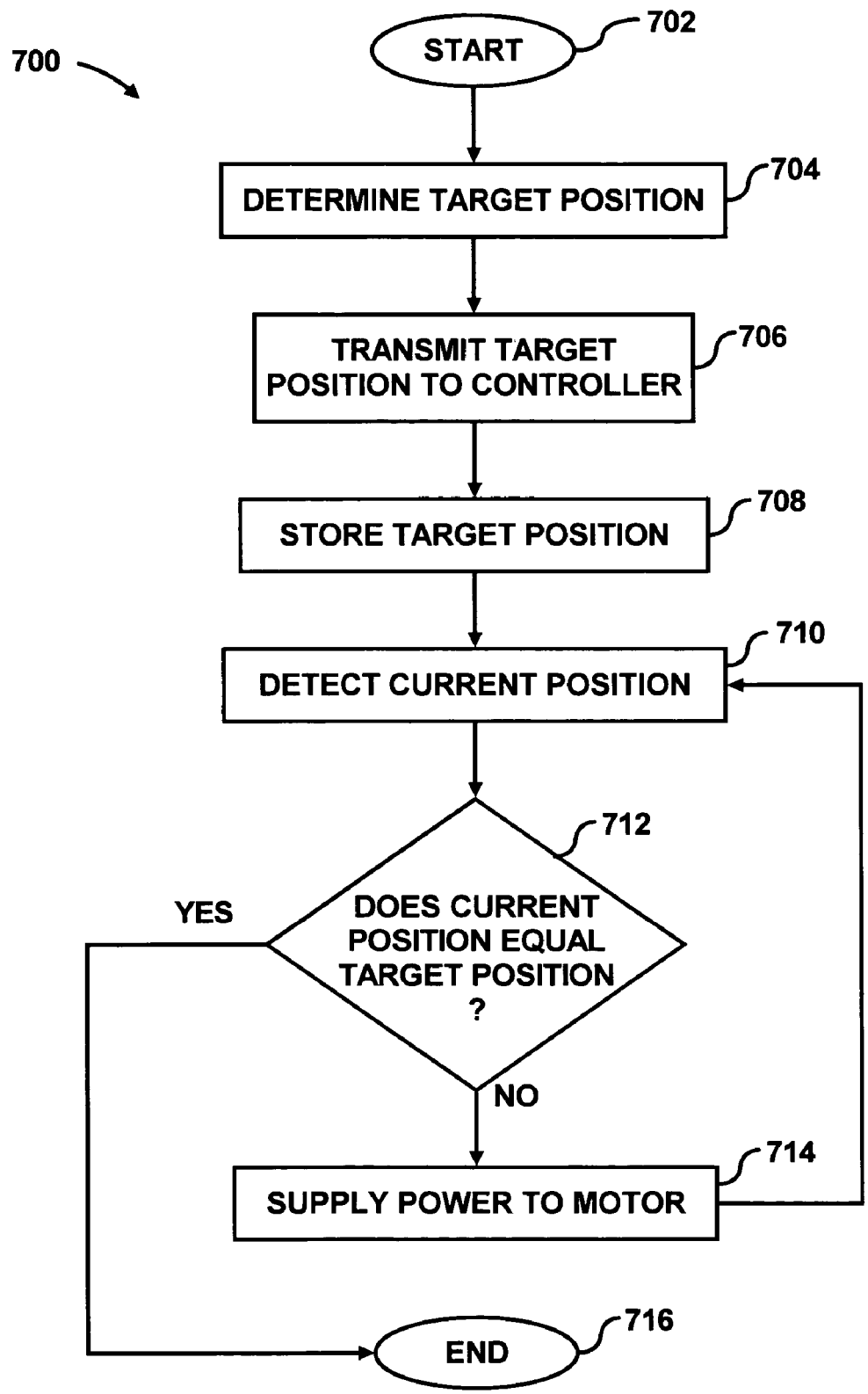
FIG. 7 shows a flow diagram of an operational mode depicting a manner in which the airflow volume varying system may be implemented according to an embodiment of the invention.

FIG. 7 shows a flow diagram of an operational mode 700 depicting a manner in which the airflow volume varying system may be implemented according to an embodiment of the invention. The following description of the operational mode 700 is made with reference to the block diagrams 500 and 600 illustrated in FIGS. 5 and 6, and thus makes reference to the elements cited therein. The following description of the operational mode 700 is one manner in which the systems 502 and 602 may be implemented. In this respect, it is to be understood that the following description of the operational mode 700 is but one manner of a variety of different manners in which such an airflow volume varying system 502, 602 may be operated. It should also be apparent to those of ordinary skill in the art that the operational mode 700 represents a generalized illustration and that other steps may be added or existing steps may be removed, modified or rearranged without departing from the scope of the invention.

The operational mode 700 may be initiated at step 702 by, for instance, activating the components in the room 100, activating a cooling system in the room 100, manually initiated, etc. Once initiated, a target position for a damper 206 may be determined. The determination of the target position may be based upon, for instance, a variation in the cooling fluid flow requirement in an area associated with a vent assembly 200. For instance, the target position may be selected to increase the size of the openings 204 to thereby increase the airflow volume delivered to the associated area of the vent assembly 200 if detected temperatures in that area is above a predetermined temperature range. Alternatively, the target position may be selected to decrease the size of the openings 204 to thereby decrease the airflow volume delivered to the associated area if detected temperatures in that area is below the predetermined temperature range. Although the target position selection has been described as being based upon temperature, other considerations may be employed in determining the target position. For instance, the target position may be selected according other detected environmental conditions, such as, humidity, pressure, air re-circulation, etc., or anticipated workloads by the components in the room 100.

In any respect, the target position may be selected according to the desired size of the openings 204 to obtain a desired result. The target position may be selected by, for instance, a user, the central controller 134, the robotic device 128, etc. In addition, at step 706, the selected target position may be transmitted to a controller, for instance, the controller 504 or 606, configured to control the movement of the damper 206 as described hereinabove. The controller may store the target position in, for instance, a memory 506, 608, at step 708.

At step 710, the current position of the damper 206 may be detected through implementation of the sensor 214, 214', 214" in any of the manners described hereinabove. The current position information obtained by the sensor 214, 214', 214" may be communicated to the controller 504, 606, as also described hereinabove. The controller 504, 606 may compare the current position to the target position to determine whether the damper 206 requires manipulation. Therefore, the controller 504, 606 may determine whether the current position substantially equals the target position at step 712. If the current position substantially equals the target position, for instance, within a degree of error, the operational mode 700 may end as indicated at step 716 since the damper 206 is in the desired position. The degree of error may be based upon the desired level of accuracy in positioning the damper 206, for instance, the degree of error may be anywhere from about a few millimeters to a few inches. Step 716 may be similar to an idle mode for the operational mode 700 since the operational mode 700 may be reactivated, for instance, when the components of the room become activated, after a predetermined period of time, in response to manual input to reactivate the operational mode 700, etc.

If the current position does not equal the target position, the controller 504, 606 may control power to be supplied to the motor 210 for a predetermined period of time at step 714. According to an example, power may be supplied to the motor 210 in a substantially continuous basis with the position of the damper 206 being detected as the motor 210 is operated. In this example, the current position of the damper 206 may be continuously detected and power may be continuously supplied to the motor 210 until the sensor 214, 214', 214" indicates that the current position of the damper 206 substantially equals the target position. Thus, at step 716, the supply of power to the motor 210 may be stopped when it is determined that the current position substantially equals the target position at step 712.

In another example, the controller 504, 606 may be configured to determine the determine the length of time the motor 210 is to be supplied with power to enable the damper 206 to reach the target position. In this case, the controller 504, 606 may implement an algorithm designed to calculate, based upon the speed of the motor 210 and the distance the damper 206 is to travel, the length of time power is to be supplied to the motor 210. In addition, under this example, constant detection of the current position may not be required and the detection of the current position may be performed to ensure that the damper 206 is in the desired position.

The steps illustrated in the operational mode 700 may be contained as a utility, program, subprogram, in any desired computer accessible medium. In addition, the operational mode 700 may be embodied by a computer program, which can exist in a variety of forms both active and inactive. For example, they can exist as software program(s) comprised of program instructions in source code, object code, executable code or other formats. Any of the above can be embodied on a computer readable medium, which include storage devices and signals, in compressed or uncompressed form.

Examples of suitable computer readable storage devices include conventional computer system RAM (random access memory), ROM (read only memory), EPROM (erasable, programmable ROM), EEPROM (electrically erasable, programmable ROM), and magnetic or optical disks or tapes. Examples of computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that those functions enumerated below may be performed by any electronic device capable of executing the above-described functions.

With respect to the example illustrated in FIG. 4C, for instance, steps 408–416 may be implemented through logic gates as described hereinabove. In this regard, the example illustrated in FIG. 4C may be configured to implement steps 408–416 without requiring storage thereof in a computer accessible medium.

Figure 8:
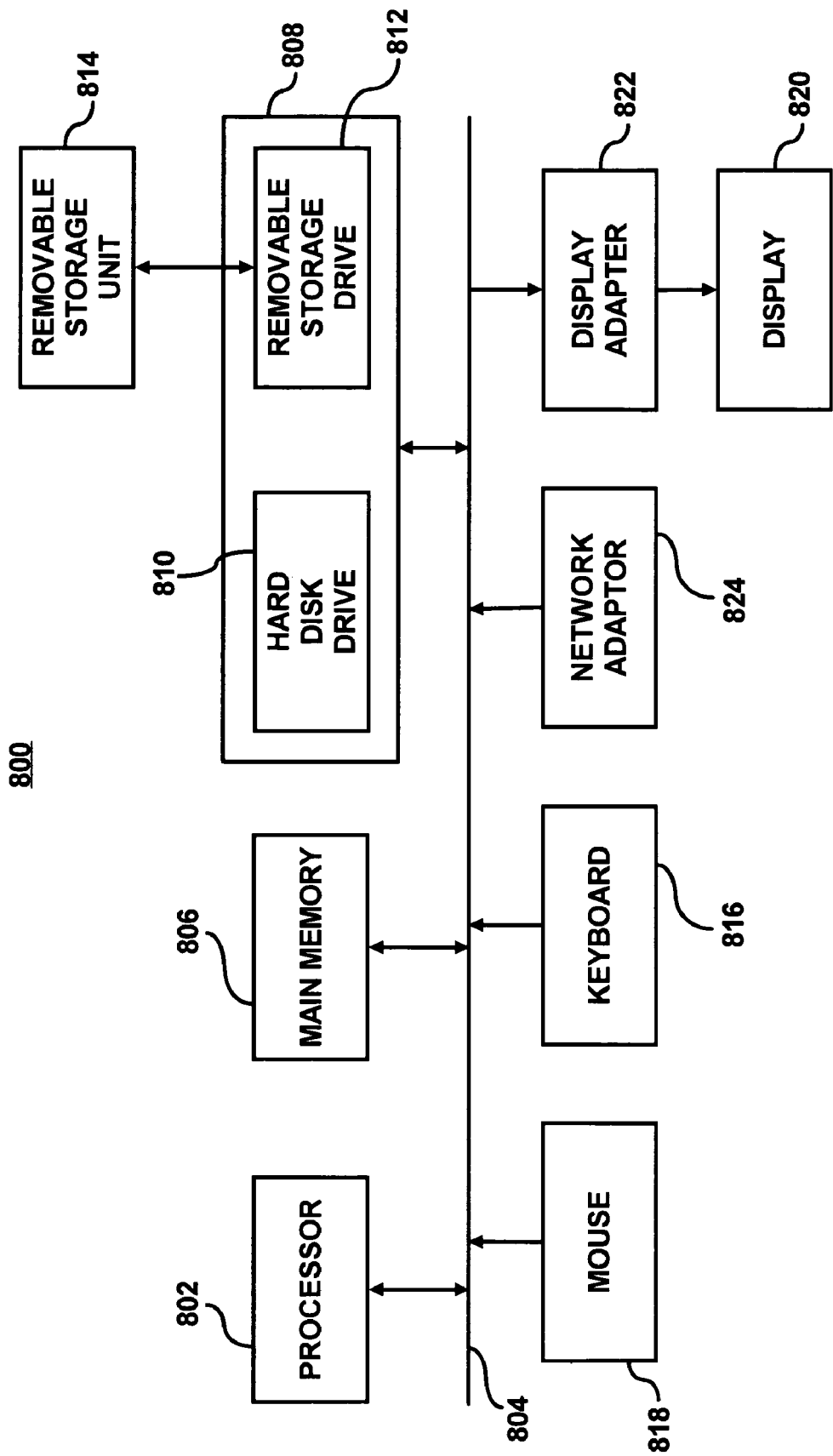
FIG. 8 illustrates an exemplary computer system, according to an embodiment of the invention.

FIG. 8 illustrates an exemplary computer system 800, according to an embodiment of the invention. The computer system 800 may include, for example, the controller 504, 606, a controller of the robotic device 128, and/or the computer system 134. In this respect, the computer system 800 may be used as a platform for executing one or more of the functions described hereinabove with respect to the various components of the airflow volume varying system.

The computer system 800 includes one or more controllers, such as a processor 802. The processor 802 may be used to execute some or all of the steps described in the operational mode 700. Commands and data from the processor 802 are communicated over a communication bus 804. The computer system 800 also includes a main memory 806, such as a random access memory (RAM), where the program code for, for instance, the controller 504, 606, may be executed during runtime, and a secondary memory 808. The secondary memory 808 includes, for example, one or more hard disk drives 810 and/or a removable storage drive 812, representing a floppy diskette drive, a magnetic tape drive, a compact disk drive, etc., where a copy of the program code for the provisioning system may be stored.

The removable storage drive 810 reads from and/or writes to a removable storage unit 814 in a well-known manner. User input and output devices may include a keyboard 816, a mouse 818, and a display 820. A display adaptor 822 may interface with the communication bus 804 and the display 820 and may receive display data from the processor 802 and convert the display data into display commands for the display 820. In addition, the processor 802 may communicate over a network, e.g., the Internet, LAN, etc., through a network adaptor 824.

It will be apparent to one of ordinary skill in the art that other known electronic components may be added or substituted in the computer system 800. In addition, the computer system 800 may include a system board or blade used in a rack in a data center, a conventional "white box" server or computing device, etc. Also, one or more of the components in FIG. 8 may be optional (e.g., user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which intended to be defined by the following claims—and their equivalents—in which all terms are meant in their broadest reasonable sense unless otherwise indicated.

What is claimed is:

1. A control system for controlling airflow through a vent to cool heat generating components in a room comprising at least one of a raised floor and a lowered ceiling, the system comprising:
    a vent assembly positioned in fluid communication with a plenum, said plenum being formed in a space created by the at least one of the raised floor and the lowered ceiling, said plenum comprising cooling airflow supplied from an air conditioning unit, said vent assembly comprising:
        a frame having an opening to allow the cooling airflow to flow through the frame;
        a movable damper for variably restricting the cooling airflow through the opening in the vent assembly;
        a motor for controlling movement of the damper;
        a sensor for determining to position of the damper; and
    a controller for controlling the motor to vary the position of the damper to thereby vary the cooling airflow through the opening in the vent assembly.

2. The control system according to claim 1, further comprising:
    a position code provided on at least one of the vent assembly and the damper, wherein the sensor is configured to read the position code to determine the position of the damper.

3. The control system according to claim 2, wherein the position code comprises a series of marks and spaces.

4. The control system according to claim 2, wherein the position code comprises a barcode and to sensor comprises a barcode reader.

5. The control system according to claim 2, wherein the position code comprises a series of indentations configured to represent damper position information and wherein the sensor comprises a tactile sensor.

6. The control system according to claim 1, wherein the position code is provided on the frame and the sensor is configured to move with the damper.

7. The control system according to claim 1, wherein the sensor is attached to the frame mid the position code is provided on the damper, and wherein the position code is configured to move with the damper.

8. The control system according to claim 1, wherein the controller is provided on at least one of the vent assembly and a device separate from the vent assembly.

9. The control system according to claim 8, wherein the device is separate from the vent assembly and comprises at least one of a central controller and a robotic device.

10. The control system according to claim 1, wherein the sensor comprises an optical sensor having an array of light emitting diodes and a corresponding array of light receiving diodes and wherein the controller is configured to determine the position of the damper based upon at least one of a blockage of light between the arrays of light emitting diodes and light receiving diodes and a reflectance of light between to arrays of light emitting diodes and light receiving diodes.

11. The control system according to claim 10, wherein the light receiving diodes are configured to send detected signals to logic gates and an addressable switch, and wherein the logic gates and the addressable switch operate as the controller.

12. The control system according to claim 11, wherein the logic gates comprise a plurality of Exclusive OR gates and a plurality of OR gates, wherein the plurality of Exclusive OR gates are configured to receive input signals from to light receiving diodes and input signals from the addressable switch and to compare the input signals from the light receiving diodes and the addressable switch, and wherein the Exclusive OR gates are configured to output one of a high value or a low value based on to comparison.

13. The control system according to claim 12, wherein the Exclusive OR gates are configured to output a high value if to input signals are the same, and wherein the Exclusive OR gates are configured to output a low value if the input signals differ.

14. The control system according to claim 13, wherein one or more of the plurality of OR gates are configured to receive input from two of the Exclusive OR gates, said one or more of the plurality of OR gates also being configured to compare the input from the two of the Exclusive OR gates and to output one of a high value and a low value based on the comparison.

15. The control system according to claim 14, wherein the one or more of the plurality of OR gates are configured to output a high value if the inputs from one or both of the two of the Exclusive OR gates is high, wherein the one or more of the plurality of OR gates are configured to output a high value if the inputs from the two of the Exclusive OR gates differ from one another, and wherein the one or more of the plurality of OR gates are configured to output a low value if the inputs from the two of the Exclusive OR gates are low.

16. The control system according to claim 15, wherein the logic gates comprise another OR gate configured to receive input from two of the plurality of OR gates, wherein the another OR gate is configured to output a high value if at least one of the two OR gates outputs a high value, and wherein the another OR gate is configured to output a low value if both of the OR gates outputs a low value.

17. The control system according to claim 16, further comprising:
    a solid state relay configured to receive input from the another OR gate, said solid state relay also being configured to supply power to the motor if the another OR gate outputs a low vale, and wherein the solid state relay is configured to supply power to the motor until the another OR gate outputs a high value.

18. The control system according to claim 1, further comprising:
    a power supply for powering the motor, wherein the controller is operable to control the motor by varying the power supplied to the motor.

19. The control system according to claim 18, wherein the power supply is provided on at least one of the vent assembly and a remote location.

20. The control system according to claim 19, wherein the power supply is provided on the remote location and the remote location comprises at least one of a robotic device and a central controller.

21. The control system according to claim 1, wherein the damper is attached to the motor through linkage having a disk and an arm, said arm being positioned on the disk offset from a center of the disk.

22. The control system according to claim 21, wherein the motor comprises a uni-directional motor and wherein the linkage enables lateral movement of the damper along two directions.

23. The control system according to claim 1, wherein the damper is attached to a drive link threadably attached to a drive screw, wherein the motor is attached to the drive screw, and wherein operation of the motor is configured to rotate the drive screw and translate the damper.

24. The control system according to claim 1, wherein the damper comprises a plurality of vanes connected through a transfer bar, wherein one of said plurality of vanes is rotatable by said motor and wherein rotation of the one of said plurality of vanes causes rotation of the others of the plurality of vanes through operation of the transfer bar.

25. The control system according to claim 1, wherein the motor is substantially centrally attached to the damper, and wherein the damper contains vanes and apertures configured to move with respect to the opening to thereby vary the size of the opening.

26. The control system according to claim 25, wherein the damper comprises position code readable by the sensor.

27. The control system according to claim 1, further comprising:
a robotic device having an interface for interfacing with the vent assembly, said vent assembly having a complementary interface to communicate with the robotic device, said robotic device being configured to supply power to the motor through the interface to vary the position of the damper.

28. A method for controlling airflow through a vent assembly positioned in fluid communication with a plenum formed in a space created by at least one of a raised floor and a lowered ceiling of a room, said plenum receiving cooling airflow from an air conditioning unit, said vent assembly having a movable damper configured to vary the size of an opening in the vent assembly and a motor to move the damper, the method comprising:
determining a target position for the damper based upon a desired volume flow rate of airflow supplied through the vent assembly from the plenum;
determining a current position of the damper;
determining whether the current position of the damper substantially equals the target position for the damper;
supplying power to the motor to move the damper in response to the current position not substantially equaling the target position; and
stopping the motor when the current position of the damper is substantially equal to the target position to thereby vary the size of the opening to a desired level and thereby vary a volume flow rate of cooling airflow supplied from the plenum.

29. The method according to claim 28, wherein the step of determining a target position forte damper comprises determining a desired airflow volume through the vent assembly and correlating a target position from the desired airflow volume.

30. The method according to claim 28, wherein the step of detecting a current position of the damper comprises detecting information from a position code, said position code including indicia configured to indicate various positions of the damper.

31. The method according to claim 30, wherein the step of detecting information from a position code comprises detecting a current position of the damper by sensing a position code positioned on at least one of a frame of the vent assembly and the damper.

32. The method according to claim 28, wherein the step of detecting a current position of the damper comprises determining the current position of the damper through detection of a number of blockages of light by the damper between an array of light emitting diodes and an array of light receiving diodes.

33. The method according to claim 28, wherein the step of detecting a current position of the damper comprises determining the current position of the damper through detection of light reflected by a position code positioned on at least one of the damper and the vent assembly.

34. The method according to claim 28, wherein the step of determining a current position of the damper comprises optically detecting the current position of the damper with an optical sensor, the method further comprising:
sending a signal related to the current position of the damper from the optical sensor to an addressable switch and an Exclusive OR gate;
sending a signal related to the target position from addressable switch to the Exclusive OR gate;
in the Exclusive OR gate, comparing whether the signal received from the optical sensor matches the signal received from the addressable switch;
outputting a high value in response to the signal received from the optical sensor matches the signal received from the addressable switch; and
outputting a low value in response to the signal received from the optical sensor differing from the signal received from the addressable switch.

35. The method according to claim 34, further comprising:
in an OR gate,
receiving input from two Exclusive OR gates;
outputting a high value in response to receipt of a high value from one or both of the two Exclusive OR gates;
outputting a low value in response to receipt of a low value from both of the two Exclusive OR gates; and
in another OR gate;
receiving input from two OR gates;
outputting a high value in response to receipt of a high value from at least one of the two OR gates; and
outputting a low value in response to receipt of a low value from both OR gates.

36. The method according to claim 35, further comprising:
sending input from the another OR gate to a solid state relay; and
in the solid state relay, supplying power to the motor in response to receipt of a low value from the another OR gate.

37. The method according to claim 36, wherein the step of supplying power to the motor comprises supplying power to the motor until receipt of a high value from the another OR gate.

38. The method according to claim 28, wherein the step of supplying power to the motor comprises supplying power from a power source located at least on one of the vent assembly or externally located on a robotic device.

39. The method according to claim 28, further comprising:

calculating a difference between the current position and the target position;

calculating a time of operation of the motor to move the damper from the current position to the target position; and wherein the step of supplying power to the motor comprises supplying power to the motor for the calculated time of operation.

40. The method according to claim 28, further comprising:

detecting a position of the damper during the step of supplying power to the motor.

41. A system for controlling airflow through a vent assembly positioned in fluid communication with a plenum formed in a space created by at least one of a raised floor and a lowered ceiling of a room, said plenum receiving cooling airflow from an air condition unit, said vent assembly having a movable damper configured to vary the size of an opening in the vent assembly and a motor to move the damper, the system comprising:

means for determining a target position for the damper based upon a desired volume flow rate of airflow supplied through the vent assembly from the plenum;

means for detecting a current position of the damper;

means for determining whether the current position of the damper substantially equals the target position for the damper;

means for supplying power to the motor to move the damper in response to the current position not substantially equaling the target position and means for stopping the motor when the current position of the damper is substantially equal to the target position to thereby vary the size of the opening to a desired level and thereby vary a volume flow rate of cooling airflow supplied from the plenum.

42. The system according to claim 41, further comprising:

means for determining a desired airflow volume through the vent assembly; and means for correlating a target position from the desired airflow volume.

43. The system according to claim 41, wherein the means for detecting a current position of the damper comprises means for detecting information from a position code, said position code including indicia configured to indicate various positions of the damper.

44. The system according to claim 41, wherein the means for detecting a current position of the damper comprises means for determining the current position of the damper through detection of a number of blockages of light by the damper between an array of light emitting diodes and an array of light receiving diodes.

45. The system according to claim 41, further comprising:

means for calculating a difference between the current position and the target position;

means for calculating a time of operation of the motor to move the damper from the current position to the target position; and wherein the means for supplying power to the motor comprises means for supplying power to the motor for the calculated time of operation.

46. The system according to claim 41, wherein the means for supplying power to the motor comprises a robotic device, said robotic device having means for interfacing with the vent assembly.

47. A computer readable medium on which is embedded one or more computer programs, said one or more computer programs implementing a method for controlling airflow through a vent assembly positioned in fluid communication with a plenum formed in a space created by at least one of a raised floor and a lowered ceiling of a room, said plenum receiving cooling airflow from an air conditioning unit, said vent assembly having a movable damper configured to vary the size of an opening in the vent assembly and a motor to move the damper, said one or more computer programs comprising a set of instructions for:

determining a target position for the damper based upon a desired volume flow rate of airflow supplied through the vent assembly from the plenum;

detecting a current position of the damper;

determining whether the current position of the damper substantially equals the target position for the damper;

supplying power to the motor to move the damper in response to the current position not substantially equaling the target position and stopping the motor when the current position of the damper is substantially equal to the target position to thereby vary the size of the opening to a desired level and thereby vary a volume flow rate of cooling airflow supplied from the plenum.

48. The computer readable storage medium according to claim 47, the one or more computer programs further comprising a set of instructions for:

determining a desired airflow volume through the vent assembly and correlating a target position from the desired airflow volume.

49. The computer readable storage medium according to claim 47, the one or more computer programs further comprising a set of instructions for:

detecting information from a position code, said position code including indicia configured to indicate various positions of the damper.

50. The computer readable storage medium according to claim 47, the one or more computer programs further comprising a set of instructions for:

detecting a current position of the damper by sensing a position code positioned on at least one of a frame of the vent assembly and the damper.

51. The computer readable storage medium according to claim 47, the one or more computer programs further comprising a set of instructions for:

determining the current position of the damper through detection of a number of blockages of light by the damper between an array of light emitting diodes and an array of light receiving diodes.

52. The computer readable storage medium according to claim 47, the one or more computer programs further comprising a set of instructions for:

supplying power horn a power source located at least on the vent assembly or externally located on a robotic device.

53. The computer readable storage medium according to claim 47, the one or more computer programs further comprising a set of instructions for:

calculating a difference between the current position and the target position;

calculating a time of operation of the motor to move the damper from the current position to the target position; and wherein the step of supplying power to the motor comprises supplying power to the motor for the calculated time of operation.

54. The computer readable storage medium according to claim 47, the one or more computer programs further comprising a set of instructions for:

detecting a position of the damper during to supply of power to the motor.

* * * * *